United States Patent
Chang et al.

(10) Patent No.: US 11,176,969 B2
(45) Date of Patent: Nov. 16, 2021

(54) MEMORY CIRCUIT INCLUDING A FIRST PROGRAM DEVICE

(71) Applicant: TAIWAN SEMICONDUCTOR MANUFACTURING COMPANY LTD., Hsinchu (TW)

(72) Inventors: Meng-Sheng Chang, Chubei (TW); Min-Shin Wu, Taipei (TW); Yao-Jen Yang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/523,953

(22) Filed: Jul. 26, 2019

(65) Prior Publication Data
US 2020/0058328 A1 Feb. 20, 2020

Related U.S. Application Data

(60) Provisional application No. 62/720,056, filed on Aug. 20, 2018.

(51) Int. Cl.
| | | |
|---|---|---|
| *G11C 11/18* | (2006.01) | |
| *G11C 5/02* | (2006.01) | |
| *G11C 17/12* | (2006.01) | |
| *G11C 8/14* | (2006.01) | |
| *G11C 17/16* | (2006.01) | |

(Continued)

(52) U.S. Cl.
CPC .............. *G11C 5/025* (2013.01); *G06F 30/39* (2020.01); *G11C 7/18* (2013.01); *G11C 8/14* (2013.01); *G11C 17/123* (2013.01); *G11C 17/165* (2013.01)

(58) Field of Classification Search
CPC ......... G11C 5/025; G11C 17/123; G11C 8/14; G11C 17/165; G11C 7/18; G11C 17/18; G11C 17/12; G11C 7/12; G11C 8/08; G06F 30/39; H01L 27/105
USPC ....................................................... 365/225.7
See application file for complete search history.

(56) References Cited

U.S. PATENT DOCUMENTS

| | | | |
|---|---|---|---|
| 7,260,442 | B2 | 8/2007 | Hwang et al. |
| 8,724,418 | B2 | 5/2014 | Kim et al. |
| 9,196,377 | B1 | 11/2015 | Park |

(Continued)

FOREIGN PATENT DOCUMENTS

| | | |
|---|---|---|
| KR | 20040070520 A | 8/2004 |
| KR | 20120011148 A | 2/2012 |

(Continued)

OTHER PUBLICATIONS

Office Action dated Sep. 25, 2020 from corresponding application No. KR 10-2019-0100338; pp. 1-4.

(Continued)

*Primary Examiner* — Tha-O H Bui
(74) *Attorney, Agent, or Firm* — Hauptman Ham, LLP

(57) ABSTRACT

A memory circuit array includes a first read device and a first program device. The first read device is coupled to a first bit line. The first read device includes a first transistor coupled to a first word line, and a second transistor coupled to the first word line. The first program device is coupled to the first read device. The first program device includes a third transistor coupled to a second word line, and a fourth transistor coupled to the second word line.

20 Claims, 20 Drawing Sheets

(51) Int. Cl.
*G11C 7/18* (2006.01)
*G06F 30/39* (2020.01)

(56) References Cited

U.S. PATENT DOCUMENTS

| | | |
|---|---|---|
| 9,256,709 B2 | 2/2016 | Yu et al. |
| 9,490,027 B2 | 11/2016 | Song |
| 2006/0018161 A1* | 1/2006 | Chen ..................... H01L 27/115 365/185.28 |
| 2013/0077376 A1* | 3/2013 | Kim ..................... G11C 17/16 365/104 |
| 2014/0040838 A1 | 2/2014 | Liu et al. |
| 2014/0056084 A1 | 2/2014 | Jeong et al. |
| 2015/0278429 A1 | 10/2015 | Chang |
| 2017/0207228 A1 | 7/2017 | Chen et al. |

FOREIGN PATENT DOCUMENTS

| | | |
|---|---|---|
| KR | 20140026223 A | 3/2014 |
| TW | 201727657 | 8/2017 |
| TW | 201806132 | 2/2018 |

OTHER PUBLICATIONS

Office Action dated Sep. 24, 2021 for corresponding case No. DE 10 2019 120 605.7. (pp. 1-8).

\* cited by examiner

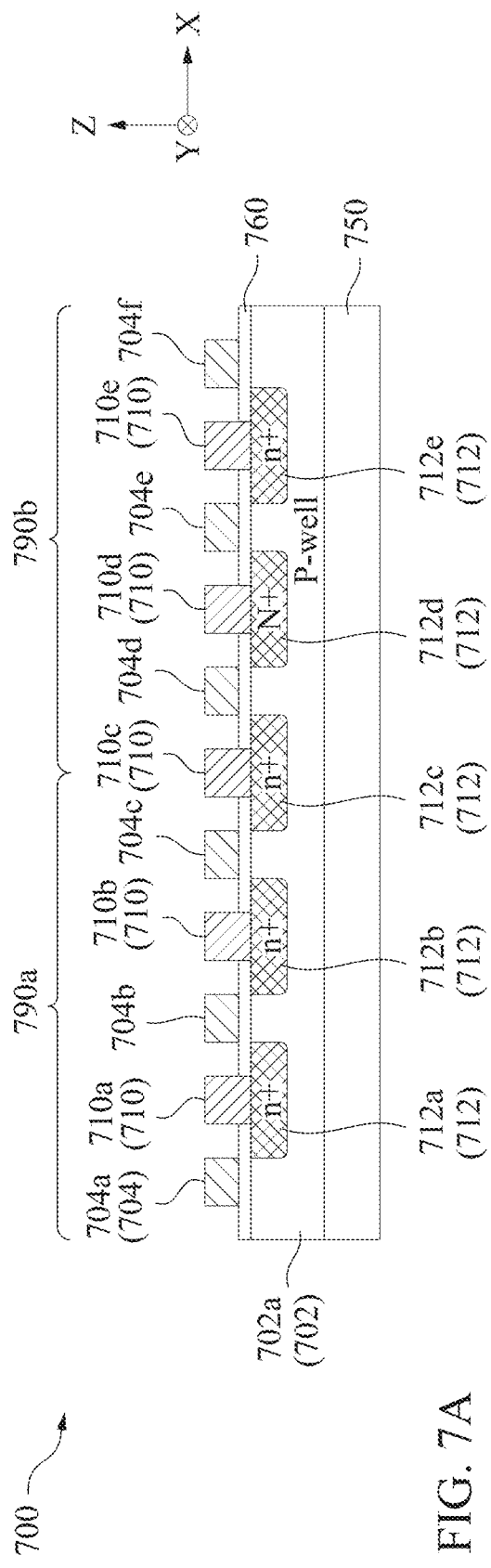
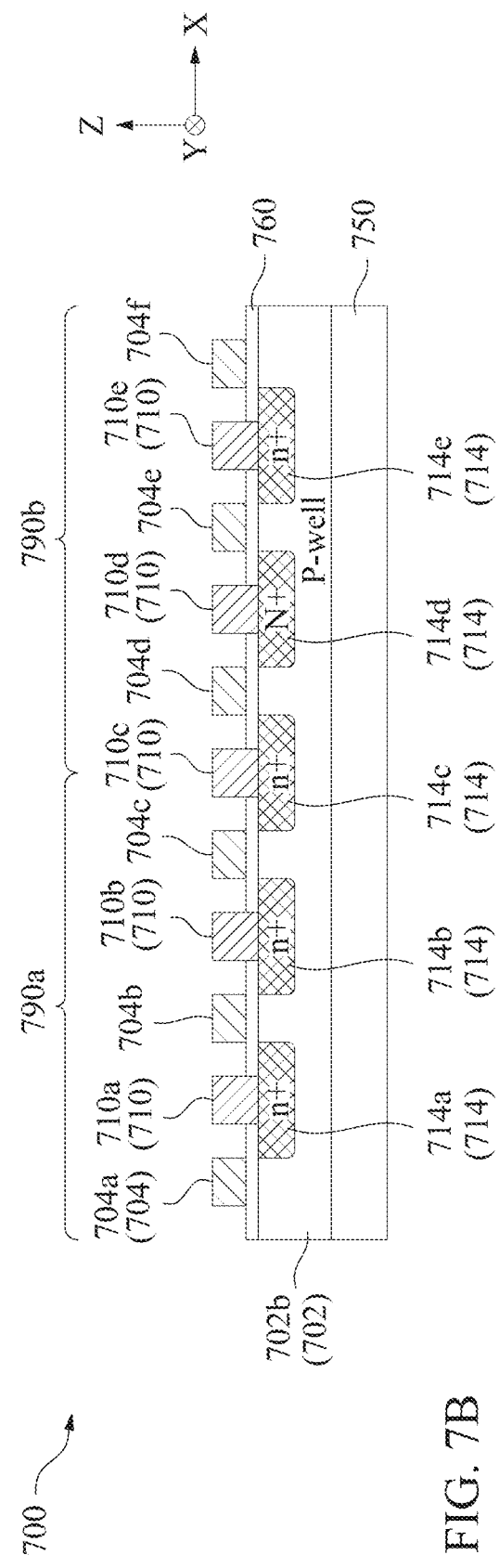
FIG. 7A
FIG. 7B

MEMORY CIRCUIT INCLUDING A FIRST PROGRAM DEVICE

PRIORITY CLAIM AND CROSS-REFERENCE

This application claims the benefit of U.S. Provisional Application No. 62/720,056, filed Aug. 20, 2018, which is herein incorporated by reference in its entirety.

BACKGROUND

The semiconductor integrated circuit (IC) industry has produced a wide variety of devices to address issues in a number of different areas. Some of these devices, such as memory cells, are configured for the storage of data. A non-volatile memory is a type of memory that is programmed to record data therein. Non-volatile memory is able to retain data after supply power is interrupted. There are various types of non-volatile memory, including, for example, a multi-time programming memory (also referred to as MTP memory), a one-time programmable (OTP) memory, or the like. As memory cells become smaller and more complex, the resistance of conductive lines within these devices are also changed affecting the characteristics of these devices and overall memory cell performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A, 7B, 7C, 7D and 7E are cross-sectional views of an integrated circuit, in accordance with some embodiments.

DETAILED DESCRIPTION

Figure 1A:
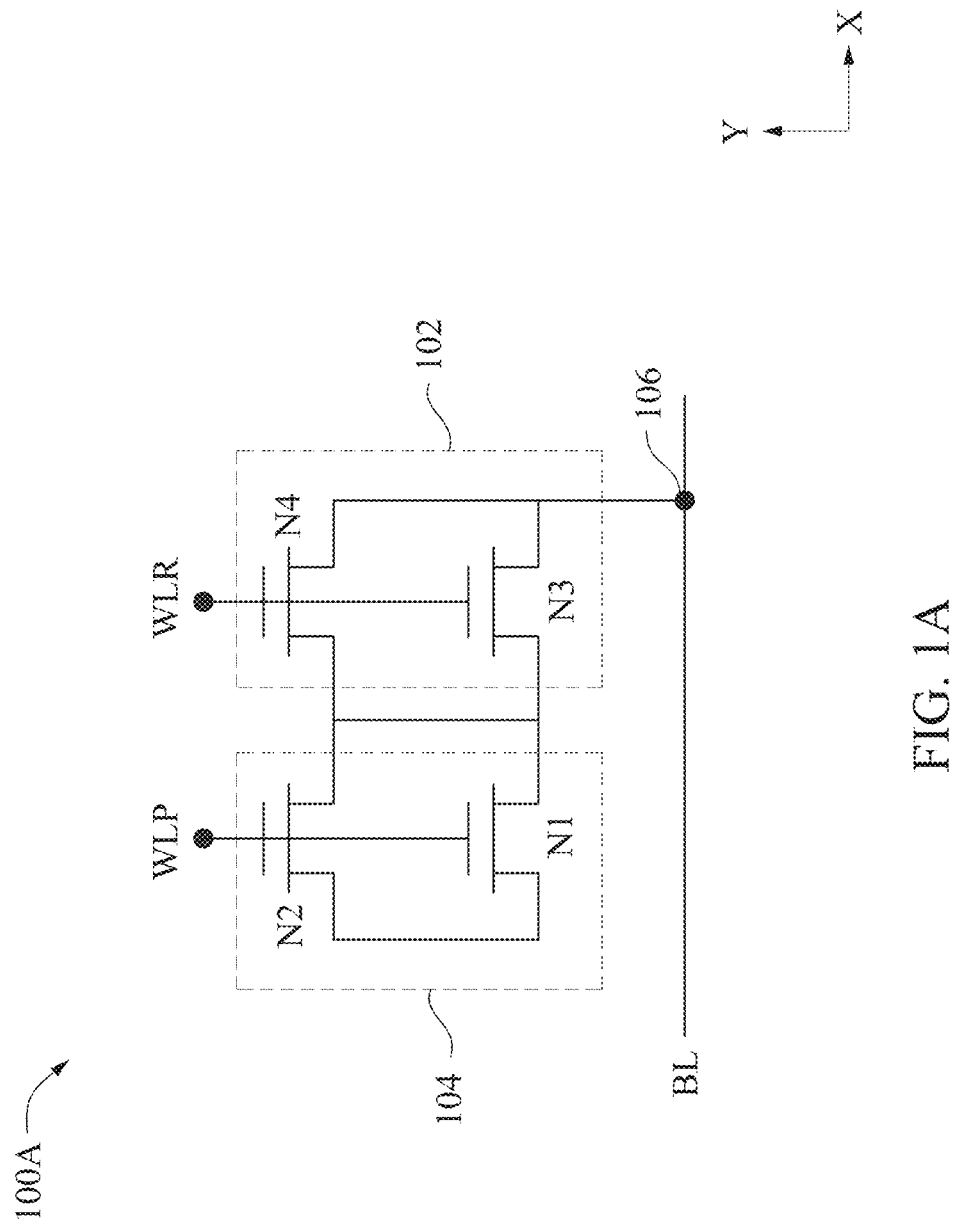
FIG. 1A is a circuit diagram of a memory cell, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory circuit includes a first read device coupled to a first bit line, and a first program device coupled to the first read device. In some embodiments, the first read device includes a first transistor coupled to a first word line, and a second transistor coupled to the first word line. In some embodiments, the first program device includes a third transistor coupled to a second word line, and a fourth transistor coupled to the second word line. In some embodiments, the first transistor and the second transistor are configured to share the first word line. In some embodiments, the third transistor and the fourth transistor is configured to share the second word line.

In some embodiments, the second transistor is coupled in parallel with the first transistor. In some embodiments, by coupling the first transistor and the second transistor connected in parallel with each other, and sharing the first word line, the first transistor and second transistor have an equivalent resistance that is lower than a resistance of the first transistor and the second transistor individually. Since the equivalent resistance of the first transistor and the second transistor is reduced, a read current or write current of the memory circuit is therefore increased resulting in memory circuit having improved reading or writing performance compared with other approaches.

In some embodiments the third transistor is connected in parallel with the fourth transistor. In some embodiments, by coupling the third transistor and the fourth transistor connected in parallel with each other, and sharing the second word line, the third transistor and the fourth transistor have an equivalent resistance that is lower than a resistance of the third transistor and the fourth transistor individually. Since the equivalent resistance of the third transistor and the fourth transistor is reduced, a read current or write current of the memory circuit is therefore increased resulting in memory circuit having improved reading or writing performance compared with other approaches.

Memory Cell

FIG. 1A is a circuit diagram of a memory cell 100A, in accordance with some embodiments.

In some embodiments, memory cell 100A is an anti-fuse memory cell. In some embodiments, memory cell 100A is a fuse memory cell. In some embodiments, memory cell 100A is also referred to as a one-time programmable (OTP) memory cell. Memory cell 100A includes a reading circuit 102 and a programming circuit 104. The reading circuit 102 is coupled between the programming circuit 104 and a bit line BL. A terminal of the reading circuit 102 is coupled to the bit line BL to receive/send data from/to the bit line BL. Memory cell 100A is configured to store a logic "1" or a logic "0" based on the resistance of programming circuit 104 of memory cell. Other types of memory are within the scope of various embodiments.

The reading circuit 102 includes at least n-type Metal-Oxide-Semiconductor (MOS) transistor N1 or NMOS transistor N2. The programming circuit 104 includes at least NMOS transistor N3 or NMOS transistor N4. Other transistors or transistor types or other numbers of transistors in at least reading circuit 102 or programming circuit 104 are within the scope of the present disclosure. For example, in some embodiments, at least reading circuit 102 or programming circuit 104 includes one or more p-type MOS (PMOS) transistors.

In some embodiments, the transistors in programming circuit 104 are coupled in parallel with each other. For example, in some embodiments, NMOS transistor N1 and NMOS transistor N2 are coupled in parallel with each other.

In some embodiments, the transistors in reading circuit 102 are coupled in parallel with each other. For example, in some embodiments, NMOS transistor N1 and NMOS transistor N2 are coupled in parallel with each other.

A first source/drain terminal of NMOS transistor N3 and a first source/drain terminal of NMOS transistor N4 are coupled to each other, and are further coupled to the bit line BL. A gate terminal of NMOS transistor N3 and a gate terminal of NMOS transistor N4 are coupled together, and are further coupled to a read word line WLR. Each of a second source/drain terminal of NMOS transistor N3, a second source/drain terminal of NMOS transistor N4, a second source/drain terminal of NMOS transistor N1, a second source/drain terminal of NMOS transistor N2 are coupled together.

A first source/drain terminal of NMOS transistor N1 and a first source/drain terminal of NMOS transistor N2 are coupled to each other. A gate terminal of NMOS transistor N1 and a gate terminal of NMOS transistor N2 are coupled together, and are further coupled to a program word line WLP.

The reference designation WLR in the present disclosure denotes a read word line throughout the description. The reference designation WLP in the present disclosure denotes a program word line throughout the description. In some embodiments, when read word line features are denoted as WLR0 and WLR1, read word lines WLR0 and WLR1 indicates that two different read word lines (e.g., WLR0 and WLR1) of corresponding memory cells are described. Similarly, when program word line features are denoted as WLP0 and WLP1, program word lines WLP0 and WLP1 indicates that two different program word lines (e.g., WLP0 and WLP1) of corresponding memory cells are described.

In some embodiments, the read word line WLR is also referred to as a "selection word line," "word line gate line," and the like. In some embodiments, the program word line WLP is also referred to as "program gate line," "anti-fuse gate line," "anti-fuse control line," and the like.

In some embodiments, NMOS transistors N3 and N4 are also referred to as "selection transistors," and NMOS transistors N1 and N2 are also referred to as "program transistors."

In some embodiments, a programming operation of memory cell 100A includes, providing a ground voltage (e.g., 0V) to the bit line BL, providing a select voltage Vdd to the read word line WLR, and providing a program voltage Vp to the program word line WLP. In some embodiments, the magnitude of the program voltage Vp is larger than that of the select voltage Vdd.

In the programming operation, in some embodiments, when NMOS transistors N3 and N4 are turned on in response to the select voltage Vdd being applied to the read word line WLR and the ground voltage being applied to the bit line BL, the program voltage Vp is applied to a gate oxide layer (e.g., gate oxide layer 760 as illustrated in FIG. 7A-7E) of NMOS transistors N1 and N2. If the program voltage Vp is greater than a withstanding voltage range of the gate oxide layer, then the gate oxide layer of NMOS transistor N1 and N2 is ruptured. In some embodiments, the ruptured gate oxide layer is configured as a resistor with a low resistance value. Thus, memory cell 100A generates a program current flowing to the bit line BL through turned-on NMOS transistors N3 and N4.

In some embodiments, during a read operation of memory cell 100A, the ground voltage (e.g., 0V) is provided to the bit line BL, the select voltage Vdd is provided to the read word line WLR, and a read voltage Vr is provided to the program word line WLP. In the read operation, in some embodiments, when NMOS transistors N3 and N4 are turned on in response to the select voltage Vdd, NMOS transistors N1 and N2 generate a read current in response to the read voltage Vr. Thus, memory cell 100A generates the read current flowing through NMOS transistors N3 and N4 to the bit line BL. In some embodiments, based on a magnitude of the read current flowing through the bit line BL, a sense amplifier (not shown) coupled to the memory cell 100A is able to correctly determine the data stored in memory cell 100A. In some embodiments, the magnitude of the select voltage Vdd is the same as that of the read voltage Vr.

The above implementations of the reading circuit 102 and the programming circuit 104 are for illustrative purposes. Various other implementations of reading circuit 102 and programming circuit 104 are within the contemplated scope of the present disclosure. For example, in some embodiments, depending on various manufacturing processes, reading circuit 102 and programming circuit 104 are implemented with other types of MOS transistors, including, for example, Fin Field Effect Transistors (FinFETs), or the like.

The configuration of the anti-fuse memory cell 100A as illustrated above for programming and reading operations is also given for illustrative purposes. Various other configurations of the anti-fuse memory cell 100A are within the contemplated scope of the present disclosure. For example, in some embodiments, other voltage values are provided to one or more of the bit line BL, the program word line WLP or the read word line WLR.

As shown in FIG. 1A, NMOS transistors N1 and N2 share the program word line WLP and are connected in parallel with each other, and therefore have an equivalent resistance that is lower than a resistance of NMOS transistor N1 or NMOS transistor N2 individually. Since the equivalent resistance of NMOS transistors N1 and N2 is reduced, the read current $I_{readT}$ of memory cell 100A is therefore increased resulting in at least memory cell 100A, memory cell array 200A-200C (FIGS. 2A2-C), array of memory cells 302 (FIG. 3), integrated circuit 700 (FIG. 7) having improved reading performance than other approaches.

Similarly, in some embodiments, since the equivalent resistance of NMOS transistors N1 and N2 is lower than the resistance of NMOS transistors N1 and N2 individually, during a write operation, a write current (not shown) provided to at least memory cell 100A, memory cell array 200A-200C (FIGS. 2A2-C), array of memory cells 302 (FIG. 3), integrated circuit 700 (FIG. 7) or to NMOS transistors N1 and N2 is increased. In some embodiments, by increasing the write current (not shown) provided to least memory cell 100A, memory cell array 200A-200C (FIGS. 2A-2C), array of memory cells 302 (FIG. 3), integrated circuit 700 (FIG. 7) results in at least memory cell 100A, memory cell array 200A-200C (FIGS. 2A2-C), array of memory cells 302 (FIG. 3), integrated circuit 700 (FIG. 7) having improved writing performance than other approaches.

Figure 1B:
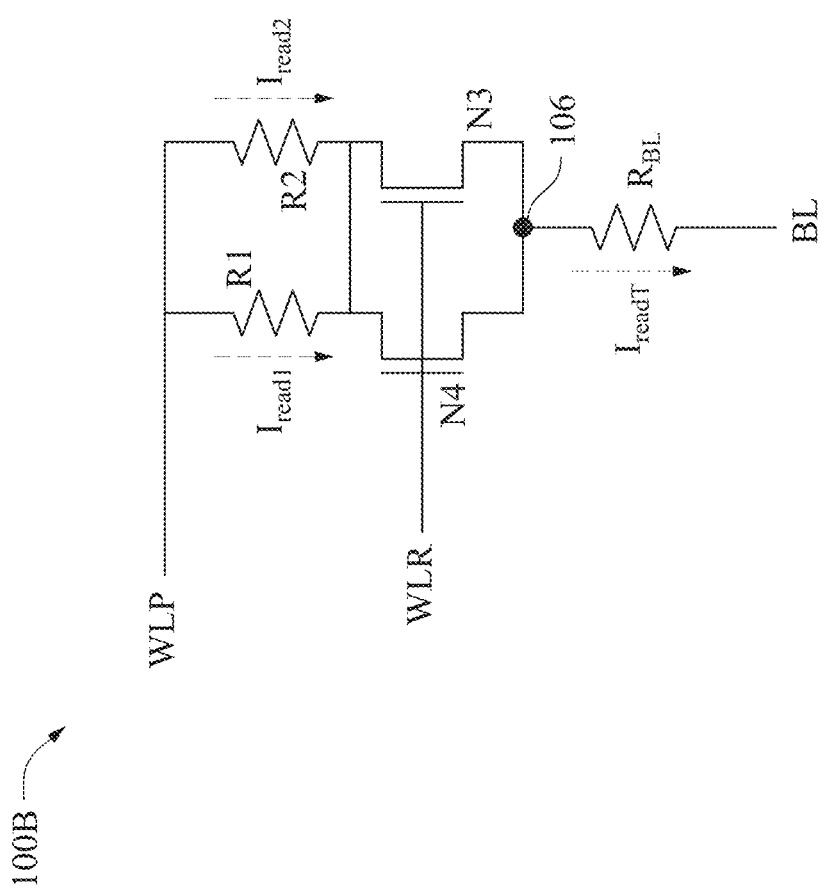
FIG. 1B is a schematic diagram of an equivalent circuit of memory cell, in accordance with some embodiments.

FIG. 1B is a schematic diagram of an equivalent circuit 100B of memory cell 100A, in accordance with some embodiments.

In some embodiments, the equivalent circuit 100B of memory cell 100A is shown for a read operation of memory cell 100A. In comparison with memory cell 100A of FIG. 1A, NMOS transistor N2 of FIG. 1A is replaced by a resistor R1 in FIG. 1B and NMOS transistor N1 of FIG. 1A is replaced by a resistor R2 in FIG. 1B. Resistor R1 corresponds to a resistance of NMOS transistor N2, and resistor R2 corresponds to a resistance of NMOS transistor N1.

In comparison with memory cell 100A of FIG. 1A, equivalent circuit 100B further includes a resistor $R_{BL}$. Resistor $R_{BL}$ corresponds to a resistance of the bit line BL.

In some embodiments, during a read operation, NMOS transistors N3 and N4 are turned on, and resistors R1 and R2 (e.g., NMOS transistors N1 and N2) pass a corresponding read current Iread1 and Iread2 to the bit line BL by corresponding NMOS transistors N3 and N4 and resistor $R_{BL}$.

Resistors R1 and R2 are coupled in parallel with each other. Similarly, NMOS transistors N3 and N4 are coupled in parallel with each other.

Resistor $R_1$ is coupled between the source terminal of NMOS transistor N4 and the program word line WLP. A read current Iread1 is configured to flow through resistance R1 and NMOS transistor N4 to node 106.

Resistor $R_2$ is coupled between the source terminal of NMOS transistor N3 and the program word line WLP. A read current Iread2 is configured to flow through resistance R2 and NMOS transistor N3 to node 106.

Node 106 is coupled to the drain terminals of NMOS transistor N3 and N4. Node 106 is also coupled to bit line BL by resistor $R_{BL}$. The read current at node 106 is equal to the sum of read current Iread1 and Iread2 or read current $I_{readT}$. In other words, resistors R1 and R2 and corresponding NMOS transistors N3 and N4 are configured in a current divider configuration.

As shown in FIG. 1B, resistors R1 and R2 share the program word line WLP and are connected in parallel and therefore have an equivalent resistance Req (not labelled) that is lower than a resistance of resistor R1 or resistor R2. Since the equivalent resistance Req of NMOS transistors N1 and N2 is reduced, the read current $I_{readT}$ is therefore increased resulting in memory cell 100A or equivalent circuit 100B having improved reading performance than other approaches.

Similarly, in some embodiments, since the equivalent resistance Req (not labelled) of memory cell 100A is lower than the resistance of resistor R1 or resistor R2, during a write operation, a write current (not shown) provided to memory cell 100A or to NMOS transistors N1 and N2 is increased. In some embodiments, by increasing the write current (not shown) provided to memory cell 100A results in memory cell 100A having improved writing performance than other approaches.

Memory Cell Array

Figure 2A:
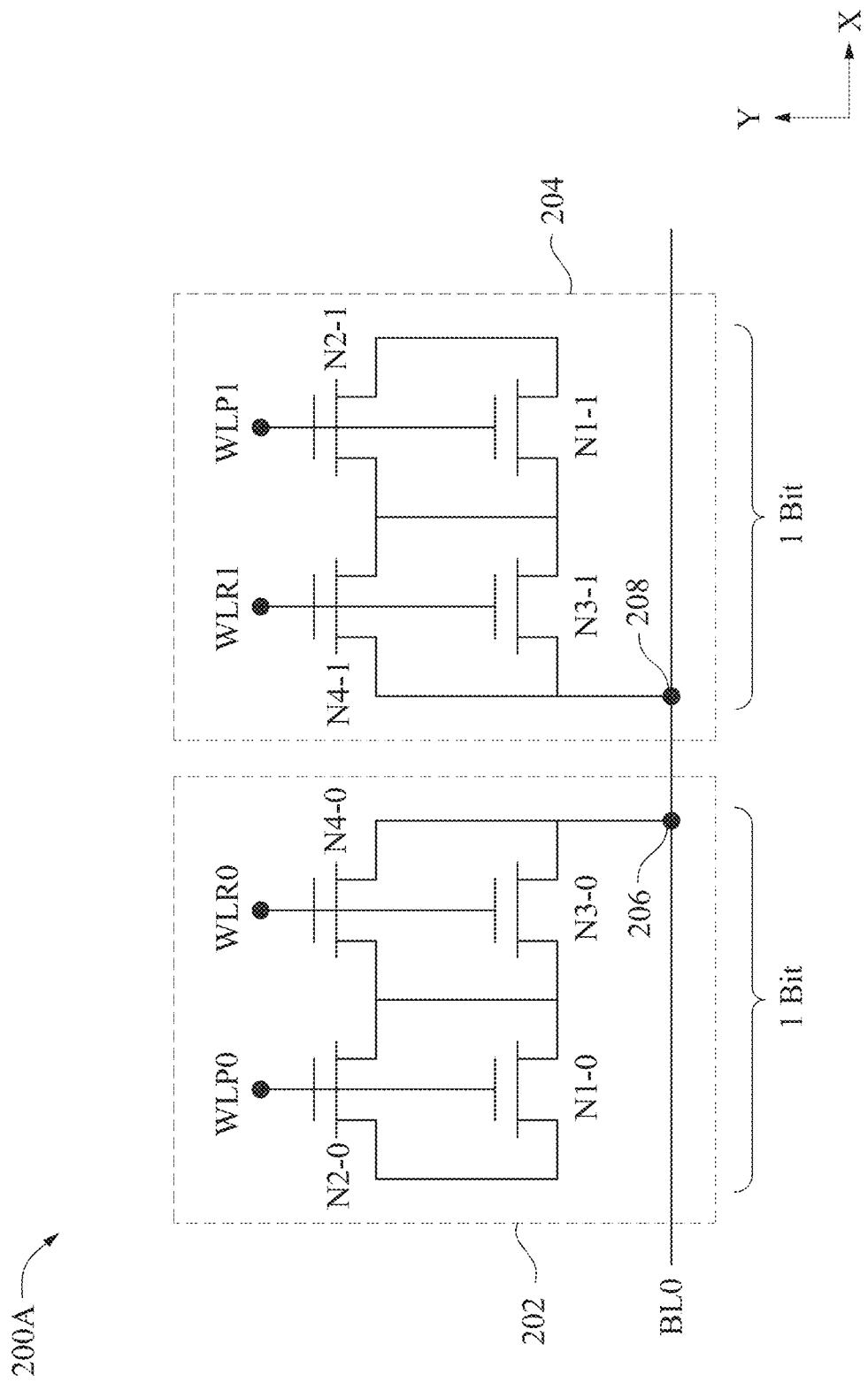
FIG. 2A is a circuit diagram of a memory cell array, in accordance with some embodiments.

FIG. 2A is a circuit diagram of a memory cell array 200A, in accordance with some embodiments.

Memory cell array 200A includes a memory cell 202, a memory cell 204, a bit line BL0, a read word line WLR0, a read word line WLR1, a program word line WLP0 and a program word line WLP1.

Program word line WLP0, read word line WLR0 and bit line BL0 are similar to corresponding program word line WLP, read word line WLR, and bit line BL of FIG. 1A, and similar detailed description is therefore omitted. Program word line WLP1 and read word line WLR1 are similar to corresponding program word line WLP and read word line WLR of FIG. 1A, and similar detailed description is therefore omitted.

Memory cells 202 and 204 are positioned next to each other, and are coupled to different read word lines as well as different program word lines. Memory cell 202 is coupled to read word line WLR0 and program word line WLP0. Memory cell 204 is coupled to read word line WLR1 and program word line WLP1. Memory cells 202 and 204 are coupled to the same bit line BL0 at nodes 206 and 208, respectively.

Memory cell 202 has a configuration similar to that of memory cell 100A of FIG. 1A, and similar detailed description is therefore omitted. Alternatively stated, the connections of NMOS transistors N1-0, N2-0, N3-0 and N4-0 are similar to corresponding connections of corresponding NMOS transistors N1, N2, N3 and N4 of FIG. 1A. Accordingly, the connections of NMOS transistors N1-0, N2-0, N3-0 and N4-0 in FIG. 2 are not further described herein for brevity. In some embodiments, memory cell 202 is configured to store one bit of data. In some embodiments, memory cell 204 is configured to store one bit of data.

Memory cell 202 includes NMOS transistors N1-0, N2-0, N3-0 and N4-0. Gate terminals of NMOS transistors N1-0, N2-0 are coupled to program word line WLP0. Gate terminals of NMOS transistors N3-0, N4-0 are coupled to read word line WLR0.

Memory cell 204 is a variation of memory cell 100A or memory cell 202. For example, memory cell 204 is a mirror image of memory cell 202 with respect to a y-axis Y. Therefore, the connections of NMOS transistors N1-1, N2-1, N3-1 and N4-1 are similar to the corresponding connections of corresponding NMOS transistors N1, N2, N3 and N4 of FIG. 1A or the corresponding connections of corresponding NMOS transistors N1-0, N2-0, N3-0 and N4-0 of memory cell 202. Accordingly, the connections of NMOS transistors N1-1, N2-1, N3-1 and N4-1 in FIG. 2 are not further described herein for brevity.

Memory cell 204 includes NMOS transistors N1-1, N2-1, N3-1 and N4-1. Gate terminals of NMOS transistors N1-1 and N2-1 are coupled to program word line WLP1. Gate terminals of NMOS transistors N3-1 and N4-1 are coupled to read word line WLR1.

A source/drain terminal of each of NMOS transistors N3-0, N4-0, N3-1 and N4-1 are coupled to the same bit line BL0. A source/drain terminal of each of NMOS transistors N3-0 and N4-0 are coupled to each other, and further coupled to bit line BL0 at node 206. A source/drain terminal of each of NMOS transistors N3-1 and N4-1 are coupled to each other, and further coupled to bit line BL0 at node 208.

NMOS transistors N1-0 and N2-0 of memory cell 202 and NMOS transistors N1-1 and N2-1 of memory cell 204 are positioned on opposite sides of memory cell array 200A.

Figure 2B:
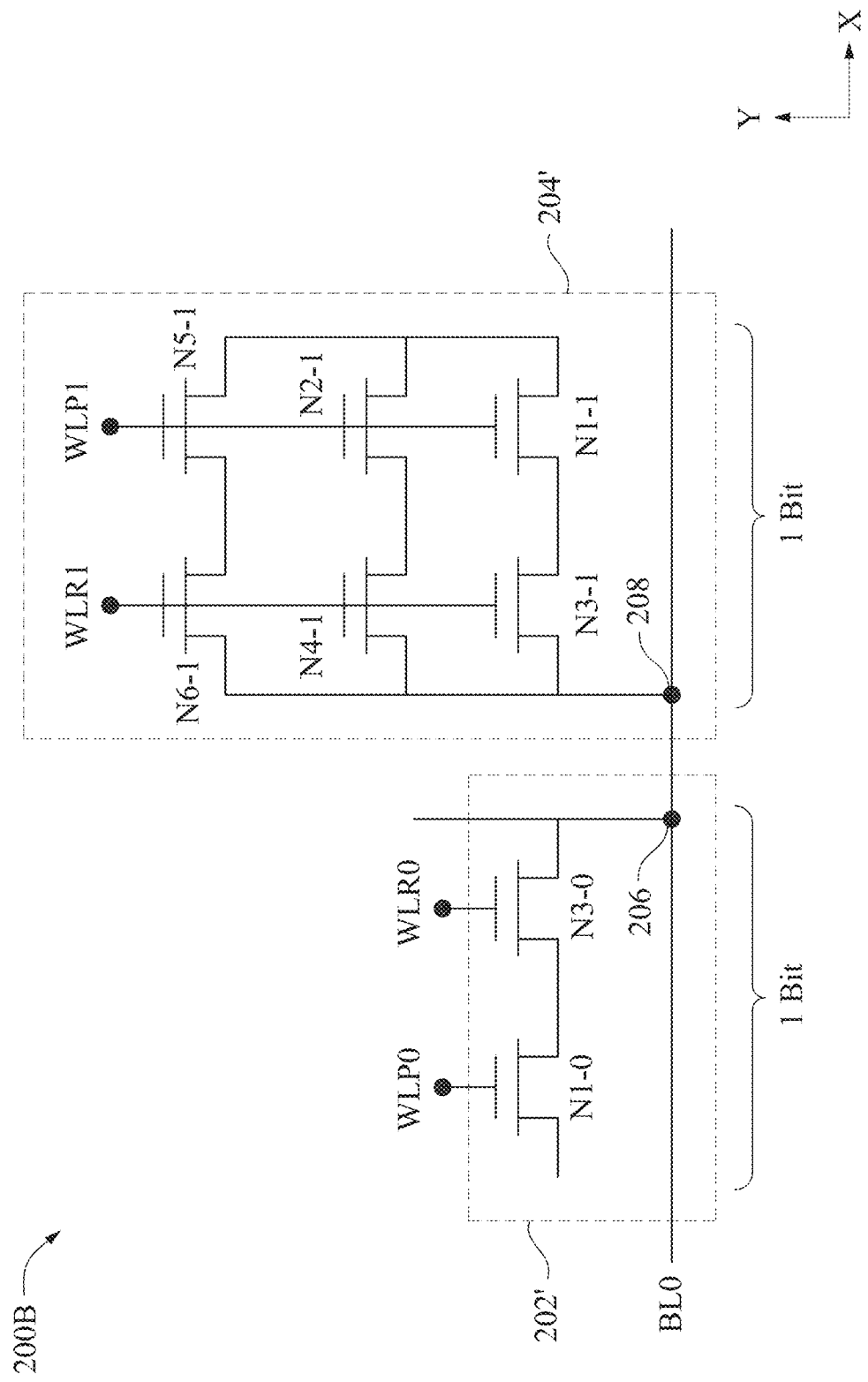
FIG. 2B is a circuit diagram of a memory cell array, in accordance with some embodiments.

FIG. 2B is a circuit diagram of a memory cell array 200B, in accordance with some embodiments.

Memory cell array 200B is a variation of memory cell array 200A. In comparison with memory cell array 200A, memory cell 202' replaces memory cell 202, memory cell 204' replaces memory cell 204, and similar detailed description is therefore omitted.

In comparison with memory cell 202, memory cell 202' does not include NMOS transistors N2-0 and N4-0. In comparison with memory cell 204, memory cell 202' further includes NMOS transistors N6-1 and N5-1.

In some embodiments, the connections of NMOS transistors N6-1, N5-1 are similar to corresponding connections of corresponding NMOS transistors N4-1, N2-1 or corresponding NMOS transistors N3-1 and N1-1 of FIG. 2A. Accordingly, the connections of NMOS transistors N6-1, N5-1 are not further described herein for brevity. In some embodiments, memory cell 202' is configured to store one bit of data. In some embodiments, memory cell 204' is configured to store one bit of data.

As shown in FIG. 2B, NMOS transistors N1-1, N2-1 and N5-1 share the program word line WLP1 and are connected in parallel with each other, and therefore have an equivalent resistance that is lower than a resistance of NMOS transistor N1-1, N2-1 or N5-1 individually. Since the equivalent resistance of NMOS transistors N1-1, N2-1 and N5-1 is reduced, the read current $I_{readT}$ of memory cell 204' is therefore increased resulting in memory cell 204' having improved reading performance than other approaches.

Similarly, in some embodiments, since the equivalent resistance of NMOS transistors N1-1, N2-1 and N5-1 is lower than the resistance of NMOS transistors N1-1, N2-1 or N5-1 individually, during a write operation, a write current (not shown) provided to at least memory cell 204' is increased. In some embodiments, by increasing the write current (not shown) provided to at least memory cell 204' results in at least memory cell 204' having improved writing performance than other approaches.

In some embodiments, by having other numbers of transistors in memory cell 202' and memory cell 204', memory cell array 200B offers a flexible configuration that is customizable based upon the application. For example, in some embodiments by including a smaller size of memory cell 202', but also including a larger memory cell 204' that has better read or better write performance than memory cell 202' allows for a hybrid approach that is customizable based upon the application compared with other approaches that have less flexible configurations. Furthermore, in some embodiments, at least memory cell 204' or memory cell 202' includes even more transistors than that shown in FIG. 2B. Other transistors or transistor types or other numbers of transistors in at least memory cell 202' or memory cell 204' are within the scope of the present disclosure.

Figure 2C:
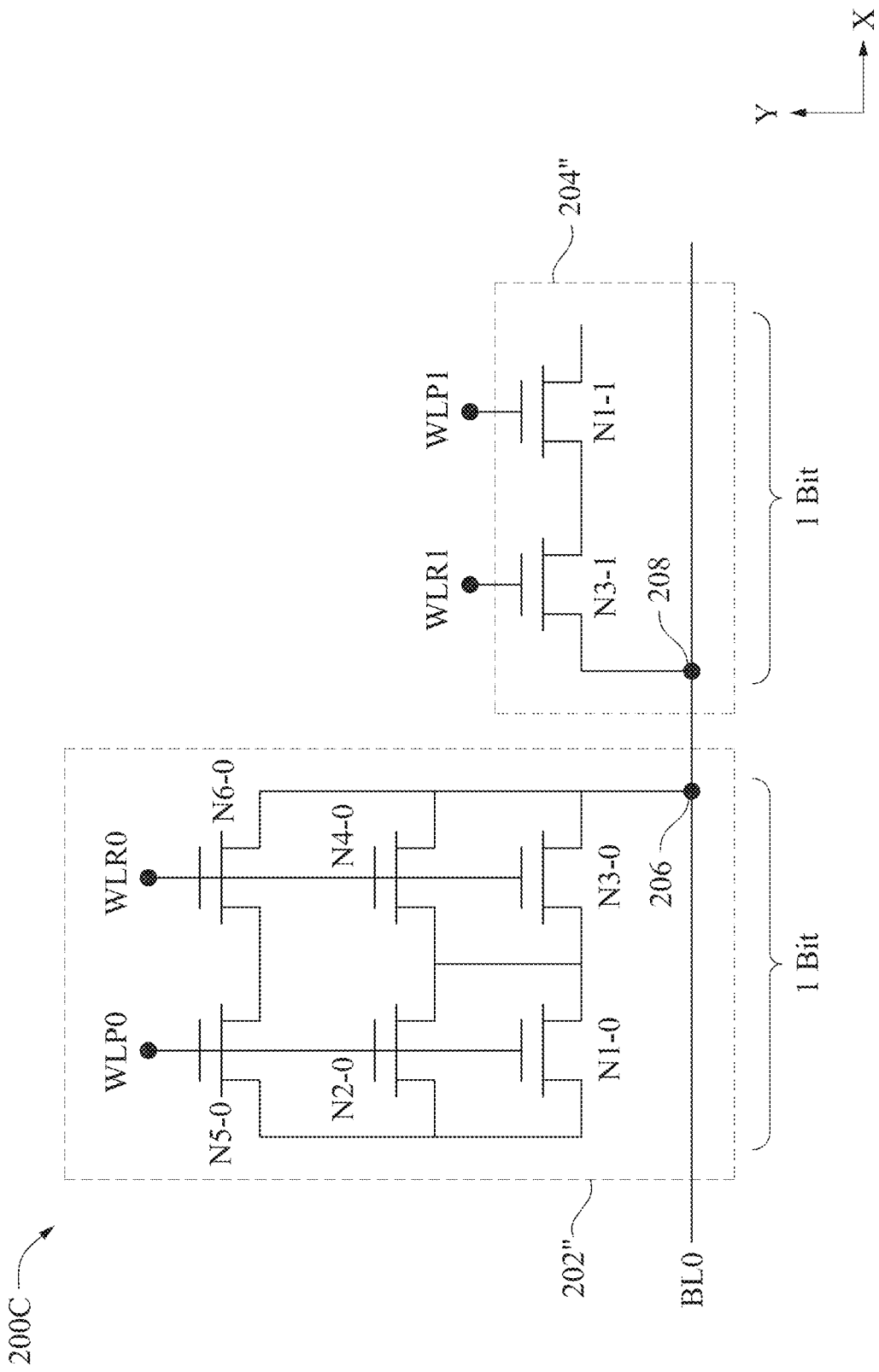
FIG. 2C is a circuit diagram of a memory cell array, in accordance with some embodiments.

FIG. 2C is a circuit diagram of a memory cell array 200C, in accordance with some embodiments.

Memory cell array 200C is a variation of memory cell array 200A. In comparison with memory cell array 200A, memory cell 202" replaces memory cell 202, memory cell 204" replaces memory cell 204, and similar detailed description is therefore omitted.

In comparison with memory cell 204, memory cell 204" does not include NMOS transistors N2-1 and N4-1. In comparison with memory cell 202, memory cell 202" further includes NMOS transistors N6-0 and N5-0.

In some embodiments, the connections of NMOS transistors N6-0, N5-0 are similar to corresponding connections of corresponding NMOS transistors N4-0, N2-0 or corresponding NMOS transistors N3-0 and N1-0 of FIG. 2A. Accordingly, the connections of NMOS transistors N6-0, N5-0 are not further described herein for brevity. In some embodiments, memory cell 202" is configured to store one bit of data. In some embodiments, memory cell 204" is configured to store one bit of data.

As shown in FIG. 2C, NMOS transistors N1-0, N2-0 and N5-0 share the program word line WLP and are connected in parallel with each other, and therefore have an equivalent resistance that is lower than a resistance of NMOS transistor N1-0, N2-0 or N5-0 individually. Since the equivalent resistance of NMOS transistors N1-0, N2-0 and N5-0 is reduced, the read current $I_{readT}$ of memory cell 202" is therefore increased resulting in memory cell 202" having improved reading performance than other approaches.

Similarly, in some embodiments, since the equivalent resistance of NMOS transistors N1-0, N2-0 and N5-0 is lower than the resistance of NMOS transistors N1-0, N2-0 or N5-0 individually, during a write operation, a write current (not shown) provided to at least memory cell 202" is increased. In some embodiments, by increasing the write current (not shown) provided to least memory cell 202" results in at least memory cell 202" having improved writing performance than other approaches.

In some embodiments, by having other numbers of transistors in memory cell 202" and memory cell 204", memory cell array 200C offers a flexible configuration that is customizable based upon the application. For example, in some embodiments by including a smaller size of memory cell 204", but also including a larger memory cell 202" that has better read or write performance than memory cell 204" allows for a hybrid approach that is customizable based upon the application compared with other approaches that have less flexible configurations. Furthermore, in some embodiments, memory cell 202" includes even more transistors than that shown in FIG. 2C. Other transistors or transistor types or other numbers of transistors in at least memory cell 202" or memory cell 204" are within the scope of the present disclosure.

Figure 3:
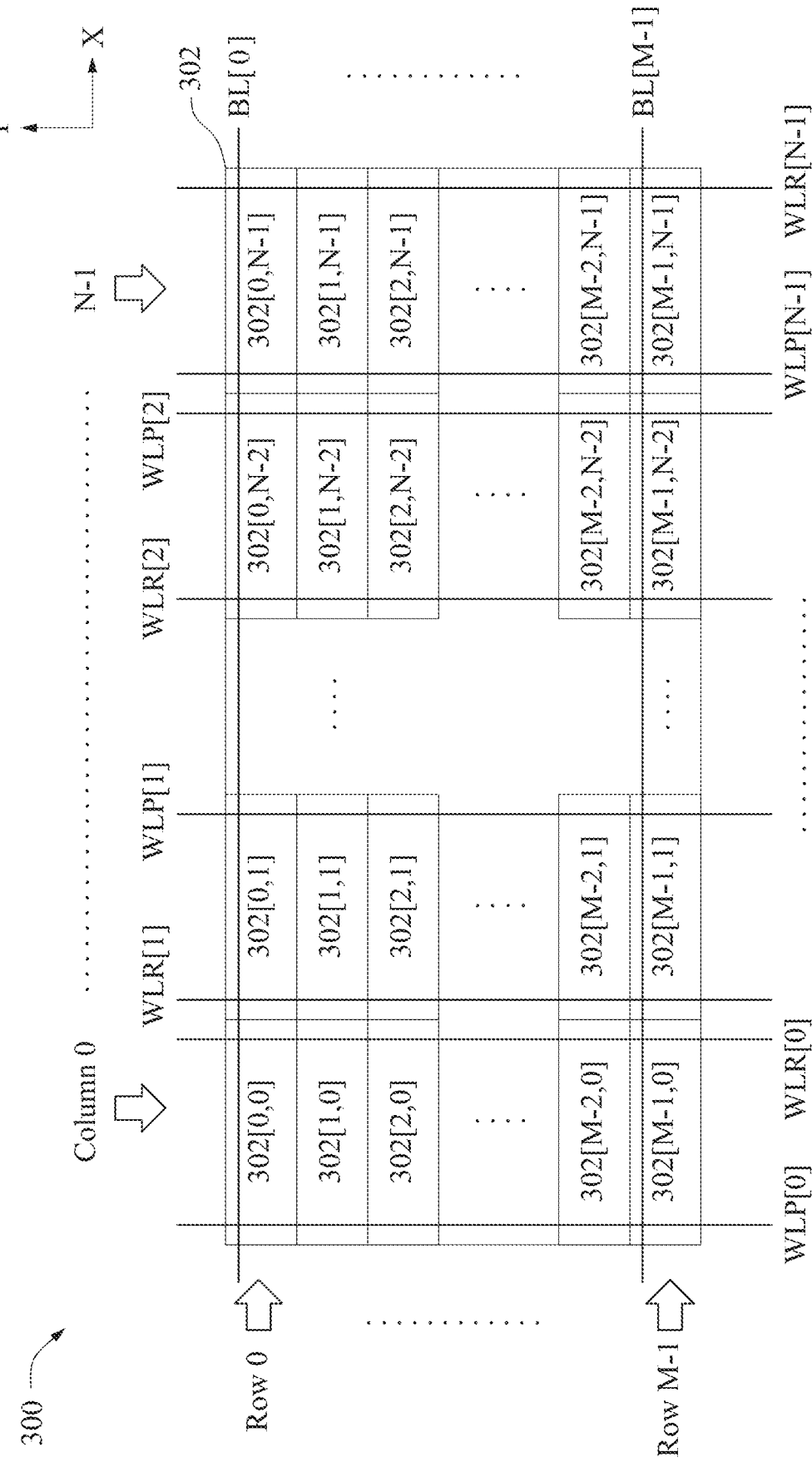
FIG. 3 is a circuit diagram of a memory cell array, in accordance with some embodiments.

FIG. 3 is a circuit diagram of a memory cell array 300, in accordance with some embodiments.

For example, memory cell 100A of FIG. 1A is usable as one or more memory cells in memory cell array 300.

Memory cell array 300 comprises an array of memory cells 302[0,0], 302[0,1], . . . , 302[M−1,N−1] (collectively referred to as "array of memory cells 302") having M rows and N columns, where N is a positive integer corresponding to the number of columns in array of memory cells 302, and M is a positive integer corresponding to the number of rows in array of memory cells 302. The rows of cells in array of memory cells 302 are arranged in a first direction X. The columns of cells in array of memory cells 302 are arranged in a second direction Y. The second direction Y is different from the first direction X. In some embodiments, the second direction Y is perpendicular to the first direction X. Memory cell 100A of FIG. 1A is usable as one or more memory cells in array of memory cells 302. Memory cell array 200A, 200B and 200C of FIGS. 2A-2C are usable as at least a pair of adjacent memory cells in a same row in array of memory cells 302. In some embodiments, an adjacent memory cell is a memory cell located directly next to another memory cell. In some embodiments, an adjacent memory cell is a memory cell located next to another memory cell.

In some embodiments, each memory cell 302[0,0], 302[0,1], . . . , 302[M–1,N–1] in array of memory cells 302 includes a corresponding memory cell 100A of FIG. 1A coupled to a corresponding program word line WLP, a corresponding read word line WLR, and a corresponding bit line BL.

Different types of memory cells in array of memory cells 302 are within the contemplated scope of the present disclosure. Different configurations of array of memory cells 302 are within the contemplated scope of the present disclosure. Furthermore, in some embodiments, array of memory cells 302 includes multiple groups of different types of memory cell.

Memory cell array 300 further includes N program word lines WLP[0], . . . WL[N–1] (collectively referred to as set of program word lines WLP') and N read word lines WLR[0], . . . WLR[N–1] (collectively referred to as read word line WLR'). Each column 0, . . . , N–1 in array of cells 302 is overlapped by a corresponding program word line WLP[0], . . . WL[N–1] and a corresponding read word line WLR[0], . . . WLR[N–1]. Each program word line WLP' or read word line WLR' extends in the second direction Y and is over a column of cells (e.g., column 0, . . . , N–1). In some embodiments, program word line WLP of FIG. 1A is usable as one or more of program word lines WLP[0], . . . WLP[N–1], and read word line WLR is usable as one or more of read word lines WLR [0], . . . WLR[N–1].

Memory cell array 300 further includes M bit lines BL[0], . . . BL[M–1] (collectively referred to as bit lines BL'). Each row 0, . . . , M–1 in array of cells 302 is overlapped by a corresponding bit line BL[0], . . . , BL[M–1]. Each bit line BL' extends in the first direction X and over a corresponding row of cells (e.g., row 0, . . . , M–1). In some embodiments, bit line BL of FIG. 1A is usable as one or more bit lines BL[0], . . . , BL[M–1]. Different configurations of bit lines BL', read word lines WLR' or program word lines WLP' in array of memory cells 302 are within the contemplated scope of the present disclosure.

Other configurations of memory cell array 300 are within the contemplated scope of the present disclosure.

Layout Design of Memory Cell Array

Figure 4A:
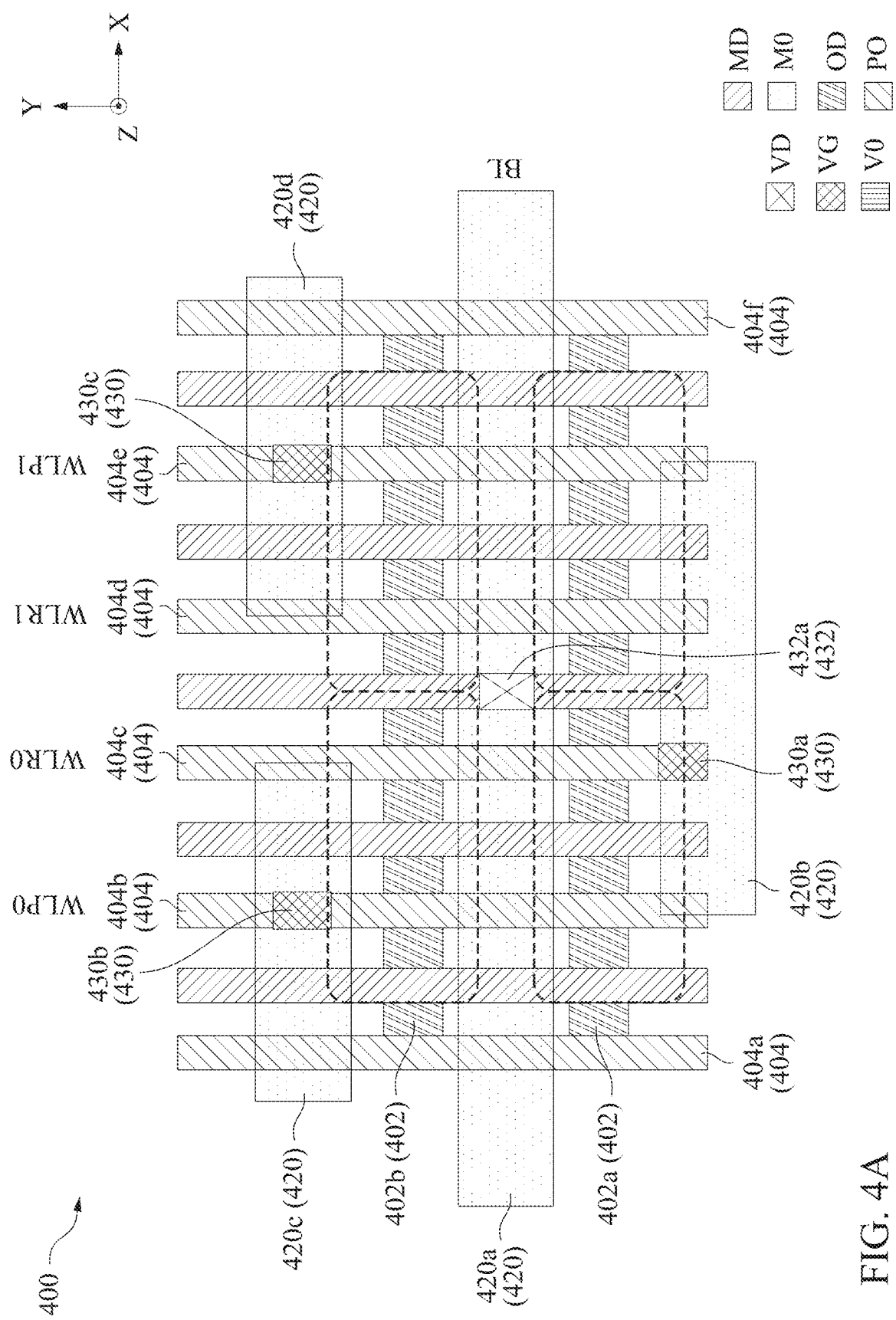
FIGS. 4A-4C are diagrams of a layout design, in accordance with some embodiments.
Figure 4B:
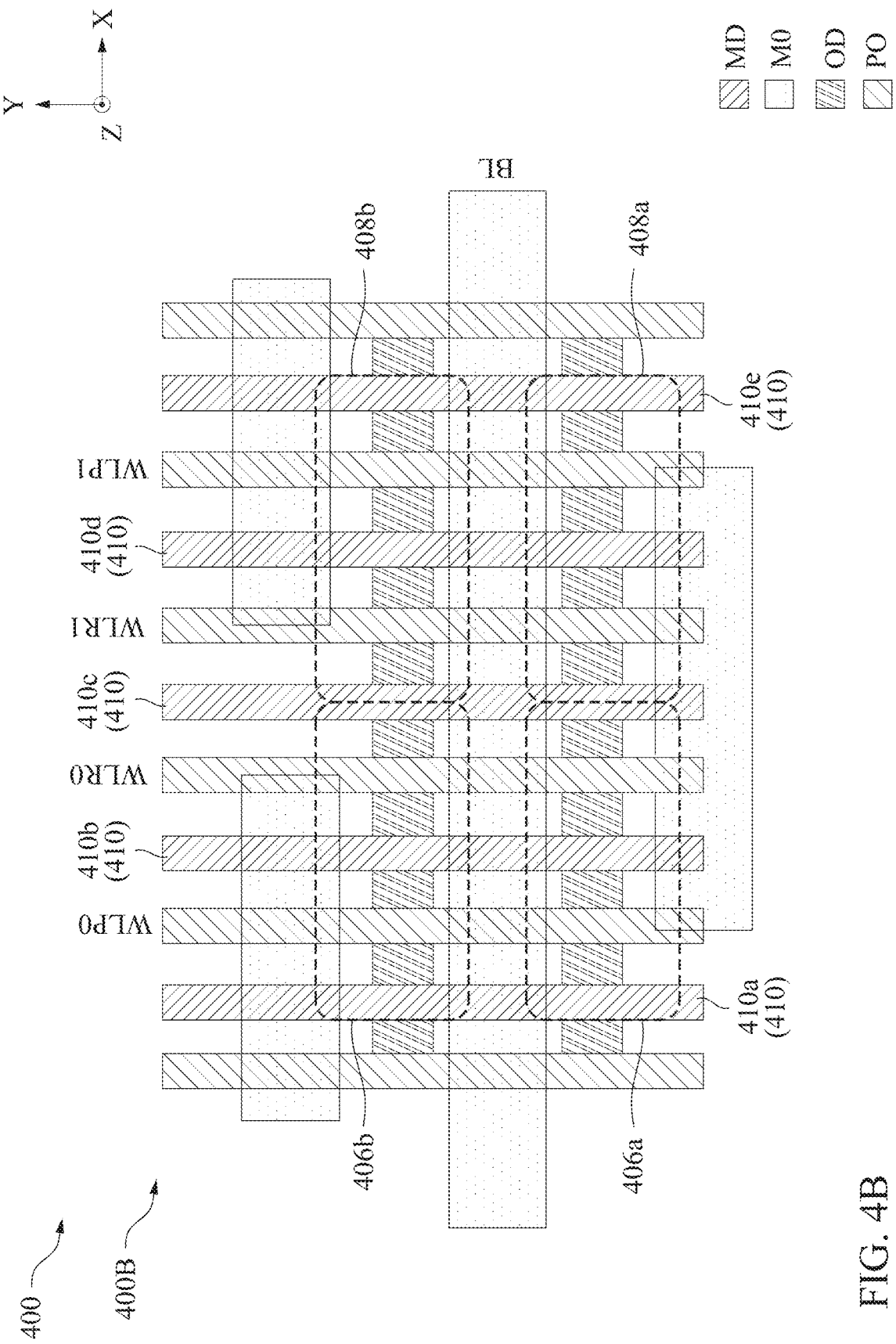
Figure 4C:
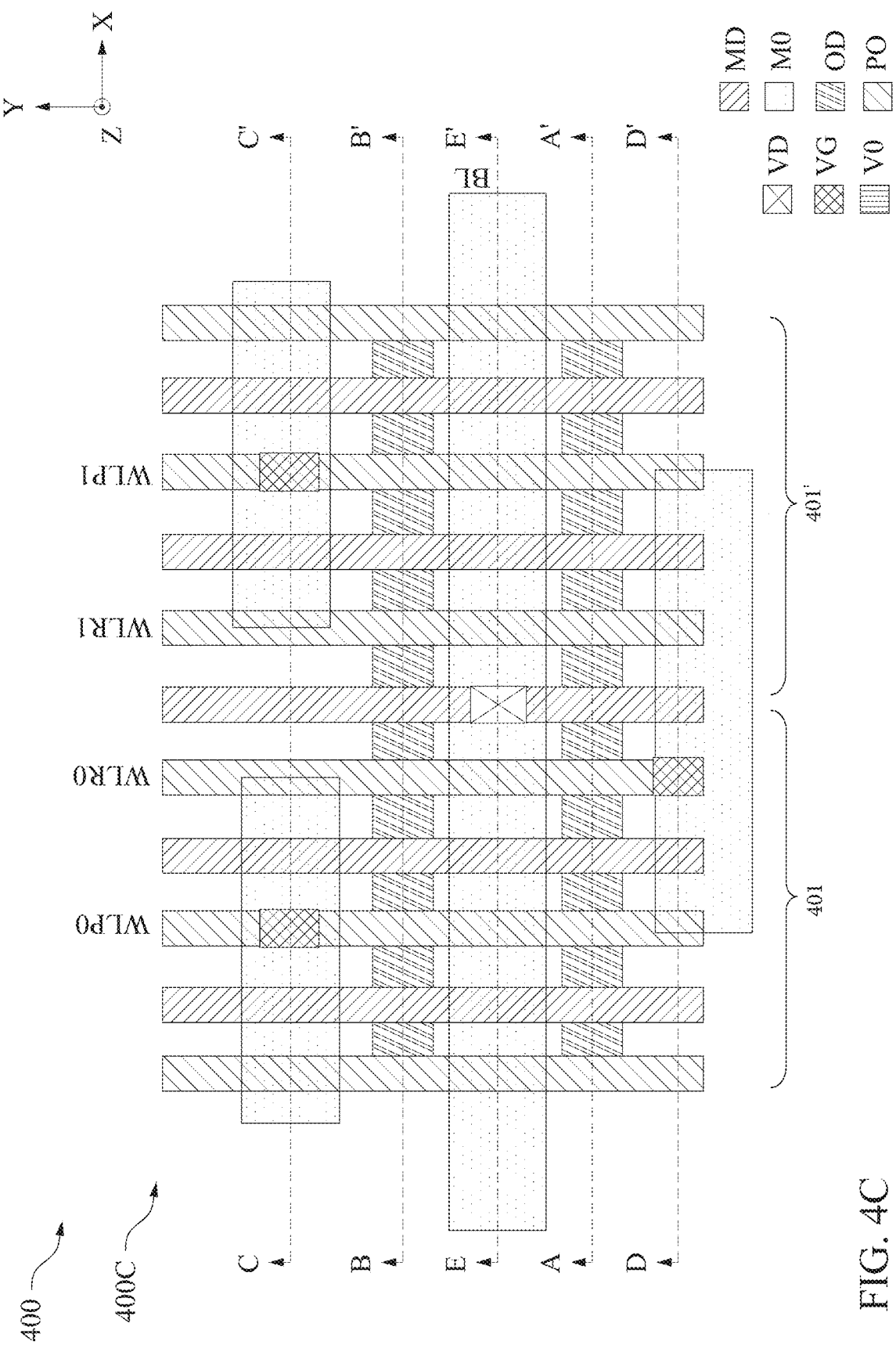

FIGS. 4A-4C are diagrams of a layout design 400, in accordance with some embodiments. Layout design 400 is a layout diagram of memory cell array 200A of FIG. 2A. Layout design 400 is usable to manufacture memory cell array 200A.

FIG. 4A is a diagram of layout design 400. For ease of illustration, some of the labeled elements of FIGS. 4B-4C are not labelled in FIG. 4A. In some embodiments, FIGS. 4A-4C include additional elements not shown in FIGS. 4A-4C.

FIGS. 4B-4C are diagrams of a corresponding portion 400B-400C of layout design 400 of FIG. 4A, simplified for ease of illustration. Portion 400B includes one or more features of layout design 400 of FIG. 4A including the active (OD) level, the POLY (PO) level, the metal over diffusion (MD) level, and the M0 level of layout design 400. Portion 400C corresponds to layout design 400 of FIG. 4A, but includes additional labelling not shown in FIG. 4A for ease of illustration.

Layout design 400 includes active region layout patterns 402a and 402b (collectively referred to as a "set of active region layout patterns 402") extending in a first direction X. Active region layout patterns 402a, 402b of the set of active region layout patterns 402 are separated from one another in a second direction Y different from the first direction X. The set of active region layout patterns 402 is usable to manufacture a corresponding set of active regions 702 (FIG. 7) of integrated circuit 700. In some embodiments, active region layout patterns 402a, 402b of the set of active region layout patterns 402 is usable to manufacture corresponding active regions 702a, 702b of the set of active regions 702 (FIG. 7) of integrated circuit 700. In some embodiments, the set of active region layout patterns 402 is referred to as an oxide diffusion (OD) region which defines the source or drain diffusion regions of integrated circuit 700.

In some embodiments, active region layout pattern 402a of the set of active region layout patterns 402 is usable to manufacture source and drain regions of each of NMOS transistor N1-0, NMOS transistor N2-0, NMOS transistor N3-0 and NMOS transistor N4-0 of FIG. 2. In some embodiments, active region layout pattern 402b of the set of active region layout patterns 402 are usable to manufacture source and drain regions of each of NMOS transistor N1-1, NMOS transistor N2-1, NMOS transistor N3-1 and NMOS transistor N4-1 of FIG. 2.

In some embodiments, the set of active region layout patterns 402 is located on a first layout level. In some embodiments, the first layout level corresponds to an active level or an OD level of one or more of layout design 400 or 600 (FIG. 4 or 6) or integrated circuit 700 (FIG. 7).

Other configurations or quantities of patterns in the set of active region layout patterns 402 are within the scope of the present disclosure.

Layout design 400 further includes at least gate layout pattern 404a, 404b, 404c, 404d, 404e or 404f (collectively referred to as a "set of gate layout patterns 404") extending in the second direction Y.

In some embodiments, each of the layout patterns of the set of gate layout patterns 404 is separated from an adjacent layout pattern of the set of gate layout patterns 404 in the first direction X by a poly pitch (not labelled). The set of gate layout patterns 404 is usable to manufacture a corresponding set of gates 704 (FIG. 7) of integrated circuit 700. In some embodiments, gate layout pattern 404a, 404b, 404c, 404d, 404e, 404f of the set of gate layout patterns 404 is usable to manufacture corresponding gate 704a, 704b, 704c, 704d, 704e, 704f of the set of gates 704 (FIG. 7) of integrated circuit 700.

The set of gate layout patterns 404 are positioned on a second layout level. In some embodiments, the second layout level is different from the first layout level. In some embodiments, the second layout level corresponds to a POLY layer of one or more of layout designs 400 or 600 (FIG. 2 or 6) or integrated circuit 700 (FIG. 7).

The set of gate layout patterns 404 overlap the set of active region layout patterns 402. The set of active region layout patterns 402 is below the set of gate layout patterns 404. In some embodiments, gate layout pattern 404a is positioned over a first side of layout design 400, and gate layout pattern 404f is positioned over a second side of layout design 400 opposite from the first side. In some embodiments, gate layout pattern 404a overlaps a first side of each of active region layout patterns 402a and 402b, and gate layout pattern 404f overlaps a second side of each of active region layout patterns 402a and 402b.

Gate layout pattern 404b is usable to manufacture the gate terminal of NMOS transistor N1-0 and the gate terminal of NMOS transistor N2-0 of FIG. 2. In some embodiments, gate layout pattern 404b is usable to manufacture the gate terminal of NMOS transistor N1 and the gate terminal of NMOS transistor N2 of FIG. 1A. In some embodiments, gate layout pattern 404b is usable to manufacture at least program word line WLP of FIG. 1A, program word line WLP0 of FIG. 2 or program word lines WLP' of FIG. 3.

Gate layout pattern 404c is usable to manufacture the gate terminal of NMOS transistor N3-0 and the gate terminal of NMOS transistor N4-0 of FIG. 2. In some embodiments, gate layout pattern 404c is usable to manufacture the gate terminal of NMOS transistor N3 and the gate terminal of NMOS transistor N4 of FIG. 1A. In some embodiments, gate layout pattern 404c is usable to manufacture at least read word line WLR of FIG. 1A, read word line WLR0 of FIG. 2 or read word lines WLR' of FIG. 3.

Gate layout pattern 404d is usable to manufacture the gate terminal of NMOS transistor N3-1 and the gate terminal of NMOS transistor N4-1 of FIG. 2. In some embodiments, gate layout pattern 404d is usable to manufacture the gate terminal of NMOS transistor N3 and the gate terminal of NMOS transistor N4 of FIG. 1A. In some embodiments, gate layout pattern 404d is usable to manufacture at least read word line WLR of FIG. 1A, read word line WLR1 of FIG. 2 or read word lines WLR' of FIG. 3.

Gate layout pattern 404e is usable to manufacture the gate terminal of NMOS transistor N1-1 and the gate terminal of NMOS transistor N2-1 of FIG. 2. In some embodiments, gate layout pattern 404e is usable to manufacture the gate terminal of NMOS transistor N1 and the gate terminal of NMOS transistor N2 of FIG. 1A. In some embodiments, gate layout pattern 404e is usable to manufacture at least program word line WLP of FIG. 1A, program word line WLP1 of FIG. 2 or program word lines WLP' of FIG. 3.

Other configurations, arrangements on other layout levels or quantities of patterns in the set of gate layout patterns 404 are within the scope of the present disclosure.

Layout design 400 further includes at least metal over diffusion layout pattern 410a, 410b, 410c, 410d or 410e (collectively referred to as a "set of metal over diffusion layout patterns 410") extending in the second direction Y. At least one of the layout patterns of the set of metal over diffusion layout patterns 410 overlaps the set of active region layout patterns 402.

The set of metal over diffusion layout patterns 410 is usable to manufacture a corresponding set of contacts 710 (FIG. 7) of integrated circuit 700. In some embodiments, metal over diffusion layout patterns 410a, 410b, 410c, 410d or 410e of the set of metal over diffusion layout patterns 410 are usable to manufacture corresponding contacts 710a, 710b, 710c, 710d or 710e of the set of contacts 710 (FIG. 7) of integrated circuit 700.

In some embodiments, each of the layout patterns of the set of metal over diffusion layout patterns 410 are separated from an adjacent layout pattern of the set of metal over diffusion layout patterns 410 in at least the first direction X. In some embodiments, each of the layout patterns of the set of metal over diffusion layout patterns 410 is positioned between a pair of gate layout patterns of the set of gate layout patterns 402. For example, metal over diffusion layout pattern 410a is between gate layout patterns 404a and 404b.

In some embodiments, the set of metal over diffusion layout patterns 410 is located on a third layout level. In some embodiments, the third layout level corresponds to a metal over diffusion (MD) level of one or more of layout design 400 or 600 (FIG. 4 or 6) or integrated circuit 700 (FIG. 7). In some embodiments, the third layout level is different from the first layout level. In some embodiments, the third layout level is the same as the second layout, and includes the MD level and the POLY level.

In some embodiments, metal over diffusion layout pattern 410a is usable to manufacture at least a drain terminal or a source terminal of each of NMOS transistor N1-0 and NMOS transistor N2-0 of FIG. 2. In some embodiments, metal over diffusion layout pattern 410a is usable to manufacture at least a drain terminal or a source terminal of each of NMOS transistor N1 and NMOS transistor N2 of FIG. 1A.

In some embodiments, metal over diffusion layout pattern 410b is usable to manufacture at least a drain terminal or a source terminal of each of NMOS transistor N1-0, NMOS transistor N2-0, NMOS transistor N3-0 and NMOS transistor N4-0 of FIG. 2. In some embodiments, metal over diffusion layout pattern 410b is usable to manufacture at least a drain terminal or a source terminal of each of NMOS transistor N1, NMOS transistor N2, NMOS transistor N3 and NMOS transistor N4 of FIG. 1A.

In some embodiments, metal over diffusion layout pattern 410c is usable to manufacture at least a drain terminal or a source terminal of each of NMOS transistor N3-0, NMOS transistor N4-0, NMOS transistor N3-1 and NMOS transistor N4-1 of FIG. 2. In some embodiments, metal over diffusion layout pattern 410c is usable to manufacture at least a drain terminal or a source terminal of each of NMOS transistor N3 and NMOS transistor N4 of FIG. 1A.

In some embodiments, metal over diffusion layout pattern 410d is usable to manufacture at least a drain terminal or a source terminal of each of NMOS transistor N3-1, NMOS transistor N4-1, NMOS transistor N1-1 and NMOS transistor N2-1 of FIG. 2. In some embodiments, metal over diffusion layout pattern 410d is usable to manufacture at least a drain terminal or a source terminal of each of NMOS transistor N1, NMOS transistor N2, NMOS transistor N3 and NMOS transistor N4 of FIG. 1A.

In some embodiments, metal over diffusion layout pattern 410e is usable to manufacture at least a drain terminal or a source terminal of each of NMOS transistor N1-1 and NMOS transistor N2-1 of FIG. 2. In some embodiments, metal over diffusion layout pattern 410e is usable to manufacture at least a drain terminal or a source terminal of each of NMOS transistor N1 and NMOS transistor N2 of FIG. 1A.

Other configurations, arrangements on other layout levels or quantities of patterns in the set of metal over diffusion layout patterns 410 are within the scope of the present disclosure.

Layout design 400 further includes at least conductive feature layout patterns 420a, 420b, 420c or 420d (hereinafter referred to as a "set of conductive feature layout patterns 420") extending in the first direction X. In some embodiments, the set of conductive feature layout patterns 420 extends in two directions (e.g., first direction X or second direction Y).

The set of conductive feature layout patterns 420 is usable to manufacture a corresponding set of conductive structures 720 (FIG. 7) of integrated circuit 700. In some embodiments, conductive feature layout patterns 420a, 420b, 420c, 420d of the set of conductive feature layout patterns 420 is usable to manufacture corresponding conductive structures 720a, 720b, 720c, 720d of the set of conductive structures 720 (FIG. 7) of integrated circuit 700. In some embodiments, conductive feature layout pattern 420a is usable to manufacture at least bit line BL0 of FIG. 2, bit line BL of FIG. 1A or bit lines BL' of FIG. 3.

The set of conductive feature layout patterns 420 overlap at least the set of gate layout patterns 404 or the set of metal over diffusion layout patterns 410. The set of conductive feature layout patterns 420 is located on a fourth layout level. In some embodiments, the fourth layout level is different from at least the first layout level, the second layout level or the third layout level. In some embodiments, the fourth layout level corresponds to a metal zero (M0) layer of one or more of layout design 400 or 600 (FIG. 4 or 6) or integrated circuit 700 (FIG. 7). Other layout levels are within the scope of the present disclosure. Other configurations, arrangements on other layout levels or quantities of patterns in the set of conductive feature layout patterns 420 are within the scope of the present disclosure.

In some embodiments, conductive feature layout pattern 420a overlaps each of the gate layout patterns in the set of gate layout patterns 404 and each of the metal over diffusion layout patterns in the set of metal over diffusion layout patterns 410. Conductive feature layout pattern 420b overlaps gate layout patterns 404b, 404c, 404d and 404e and metal over diffusion layout patterns 410b, 410c and 410d. Conductive feature layout pattern 420c overlaps gate layout patterns 404a, 404b and 404c and metal over diffusion layout patterns 410a and 410b. Conductive feature layout pattern 420d overlaps gate layout patterns 404d, 404e and 404f and metal over diffusion layout patterns 410d and 410e.

Other configurations or quantities of patterns in the set of conductive feature layout patterns 420 are within the scope of the present disclosure.

Layout design 400 further includes at least via layout pattern 430a, 430b or 430c (collectively referred to as a "set of via layout patterns 430"). The set of via layout patterns 430 is usable to manufacture a corresponding set of vias 730 (FIG. 7). In some embodiments, via layout patterns 430a, 430b, 430c of the set of via layout patterns 430 is usable to manufacture corresponding vias 730a, 730b, 730c of the set of vias 730 (FIG. 7) of integrated circuit 700.

In some embodiments, the set of via layout patterns 430 are between the set of conductive feature layout patterns 420 and the set of gate layout patterns 404. Via layout patterns 430a, 430b, 430c are between corresponding conductive feature layout patterns 420b, 420c, 420d and corresponding gate layout patterns 404c, 404b, 404e. In some embodiments, via layout pattern 430a, 430b, 430c is located where a corresponding conductive feature layout pattern 420b, 420c, 420d overlaps corresponding gate layout patterns 404c, 404b, 404e.

Set of via layout patterns 430 are positioned at a via over gate (VG) level of one or more of layout designs 400 or 600 (FIG. 4 or 6) or integrated circuit 700 (FIG. 7). In some embodiments, the VG level is between the M0 level and the POLY level. In some embodiments, the VG level is between the fourth layout level and the second layout level. Other layout levels are within the scope of the present disclosure.

Other configurations, arrangements on other layout levels or quantities of patterns in the set of via layout patterns 430 are within the scope of the present disclosure.

Layout design 400 further includes at least via layout pattern 432a (collectively referred to as a "set of via layout patterns 432"). The set of via layout patterns 432 is usable to manufacture a corresponding set of vias 732 (FIG. 7). In some embodiments, via layout patterns 432a of the set of via layout patterns 432 is usable to manufacture corresponding vias 732a of the set of vias 732 (FIG. 7) of integrated circuit 700.

In some embodiments, the set of via layout patterns 432 are between the set of conductive feature layout patterns 420 and the set of metal over diffusion layout patterns 410. Via layout pattern 432a is between corresponding conductive feature layout pattern 420a and corresponding metal over diffusion layout patterns 410c. In some embodiments, via layout pattern 432a is located where corresponding conductive feature layout pattern 420a overlaps corresponding metal over diffusion layout patterns 410c.

Set of via layout patterns 432 are positioned at a via over diffusion (VD) level of one or more of layout designs 400 or 600 (FIG. 4 or 6) or integrated circuit 700 (FIG. 7). In some embodiments, the VD level is between the M0 level and the MD level. In some embodiments, the VD level is between the fourth layout level and the third layout level. Other layout levels are within the scope of the present disclosure.

Other configurations, arrangements on other layout levels or quantities of patterns in the set of via layout patterns 432 are within the scope of the present disclosure.

Layout design 400 further includes a memory cell region 401 and a memory cell region 401'.

In some embodiments, memory cell region 401 (FIG. 4C) is a layout diagram of memory cell 202 of memory cell array 200A of FIG. 2A. In some embodiments, memory cell region 401' (FIG. 4C) is a layout diagram of memory cell 204 of memory cell array 200A of FIG. 2A. In some embodiments, memory cell region 401 is usable to manufacture memory cell 202 of memory cell array 200A of FIG. 2A. In some embodiments, memory cell region 401' is usable to manufacture memory cell 204 of memory cell array 200A of FIG. 2A. In some embodiments, memory cell region 401 (FIG. 4C) or memory cell region 401' (FIG. 4C) of layout design 400 is a layout diagram of memory cell 100A of FIG. 1A. In some embodiments, memory cell region 401 or memory cell region 401' of layout design 400 is usable to manufacture memory cell 100A of FIG. 1A.

In some embodiments, memory cell region 401 includes the layout patterns of layout design 400 useable to manufacture memory cell 202 of memory cell array 200A of FIG. 2A. For example, in some embodiments, memory cell region 401 includes at least gate layout pattern 404a, gate layout pattern 404b, gate layout pattern 404c, a portion of active region layout pattern 402a, a portion of active region layout pattern 402b, metal over diffusion layout pattern 410a, metal over diffusion layout pattern 410b, at least a portion of metal over diffusion layout pattern 410c, via layout pattern 430a, via layout pattern 430b, via layout pattern 430c, via layout pattern 432a, conductive feature layout pattern 420a, conductive feature layout pattern 420b or conductive feature layout pattern 420c.

In some embodiments, memory cell region 401' includes the layout patterns of layout design 400 useable to manufacture memory cell 204 of memory cell array 200A of FIG. 2A. For example, in some embodiments, memory cell region 401' includes at least gate layout pattern 404d, gate layout pattern 404e, gate layout pattern 404f, another portion of active region layout pattern 402a, another portion of active region layout pattern 402b, metal over diffusion layout pattern 410d, metal over diffusion layout pattern 410e, at least a portion of metal over diffusion layout pattern 410e, via layout pattern 430c, via layout pattern 432a, conductive feature layout pattern 420a, conductive feature layout pattern 420b or conductive feature layout pattern 420d.

Memory cell region 401 includes regions 406a and 406b. In some embodiments, region 406a includes the layout patterns of layout design 400 useable to manufacture NMOS transistor N1-0 and NMOS transistor N3-0 of memory cell 202 of FIG. 2. In some embodiments, region 406b includes the layout patterns of layout design 400 useable to manufacture NMOS transistor N2-0 and NMOS transistor N4-0 of memory cell 202 of FIG. 2.

In some embodiments, region 406a includes at least gate layout pattern 404a, gate layout pattern 404b, gate layout pattern 404c, a portion of active region layout pattern 402a, metal over diffusion layout pattern 410a, metal over diffusion layout pattern 410b, at least a portion of metal over diffusion layout pattern 410c, via layout pattern 430a, via layout pattern 432a, conductive feature layout pattern 420a or conductive feature layout pattern 420b.

In some embodiments, region 406b includes at least gate layout pattern 404a, gate layout pattern 404b, gate layout pattern 404c, a portion of active region layout pattern 402b, metal over diffusion layout pattern 410a, metal over diffusion layout pattern 410b, at least a portion of metal over diffusion layout pattern 410c, via layout pattern 430b, via layout pattern 432a, conductive feature layout pattern 420a or conductive feature layout pattern 420c.

Memory cell region 401' includes regions 408a and 408b. In some embodiments, region 408a includes the layout patterns of layout design 400 useable to manufacture NMOS transistor N3-1 and NMOS transistor N1-1 of memory cell 204 of FIG. 2. In some embodiments, region 408b includes the layout patterns of layout design 400 useable to manufacture NMOS transistor N2-1 and NMOS transistor N4-1 of memory cell 202 of FIG. 2.

In some embodiments, region 408a includes gate layout pattern 404d, gate layout pattern 404e, gate layout pattern 404f, another portion of active region layout pattern 402a, metal over diffusion layout pattern 410d, metal over diffusion layout pattern 410e, at least a portion of metal over diffusion layout pattern 410e, via layout pattern 432a, conductive feature layout pattern 420a or conductive feature layout pattern 420b.

In some embodiments, region 408b includes gate layout pattern 404d, gate layout pattern 404e, gate layout pattern 404f, another portion of active region layout pattern 402b, metal over diffusion layout pattern 410d, metal over diffusion layout pattern 410e, at least a portion of metal over diffusion layout pattern 410e, via layout pattern 430c, via layout pattern 432a, conductive feature layout pattern 420a or conductive feature layout pattern 420d.

Other configurations, arrangements on other layout levels or quantities of patterns in layout design 400 are within the scope of the present disclosure. For example, in some embodiments, layout design 400 can be modified to include other numbers of at least region 406a or region 406b (e.g., see FIGS. 5A-5C) within memory cell region 401 of layout design 400. Similarly, in some embodiments, layout design 400 can be modified to include other numbers of at least region 408a or region 408b (e.g., see FIGS. 5A-5C) within memory cell region 401' of layout design 400.

Figure 5A:
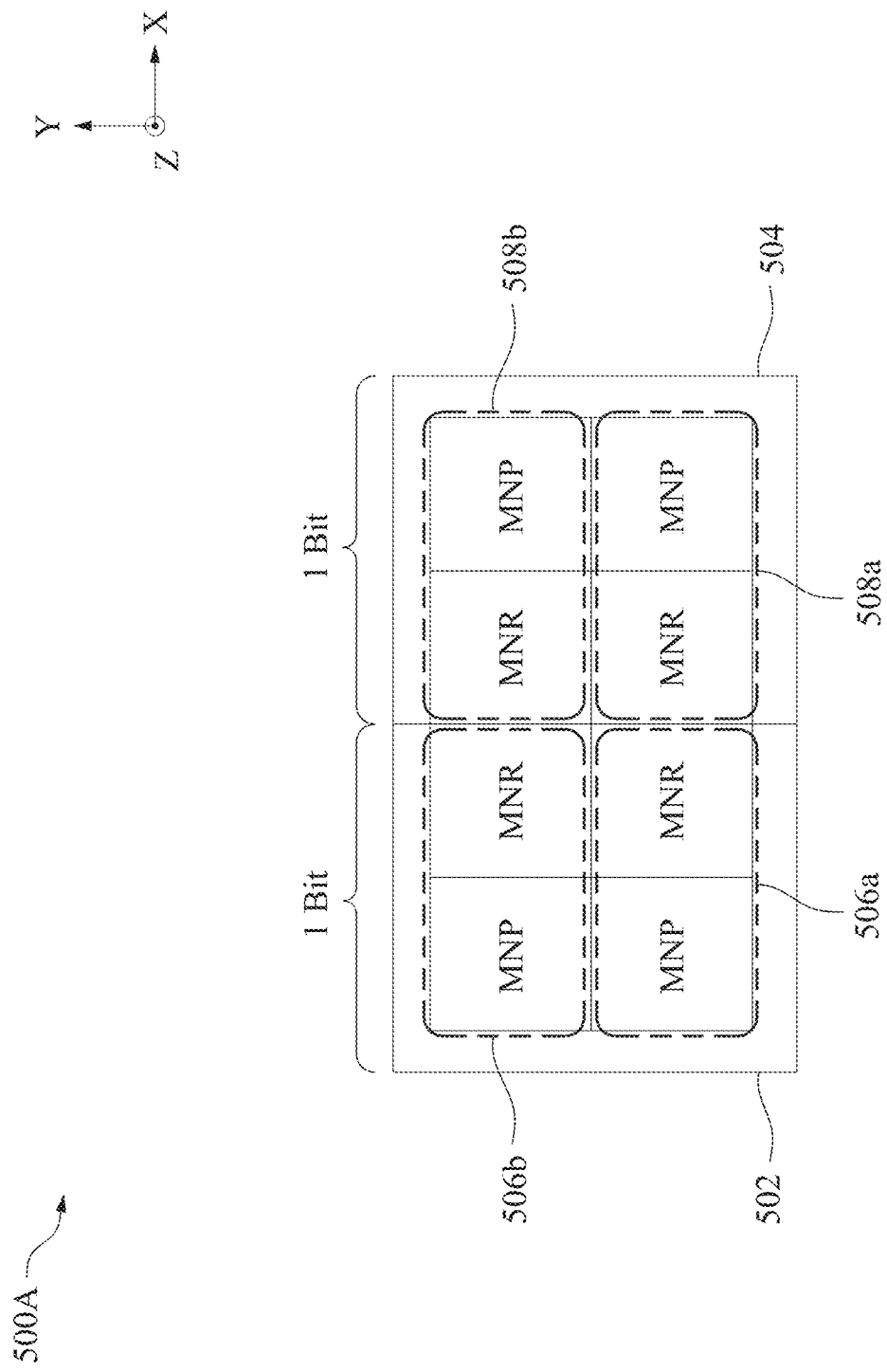
FIGS. 5A-5C are schematic diagrams of a layout design, in accordance with some embodiments.
Figure 5B:
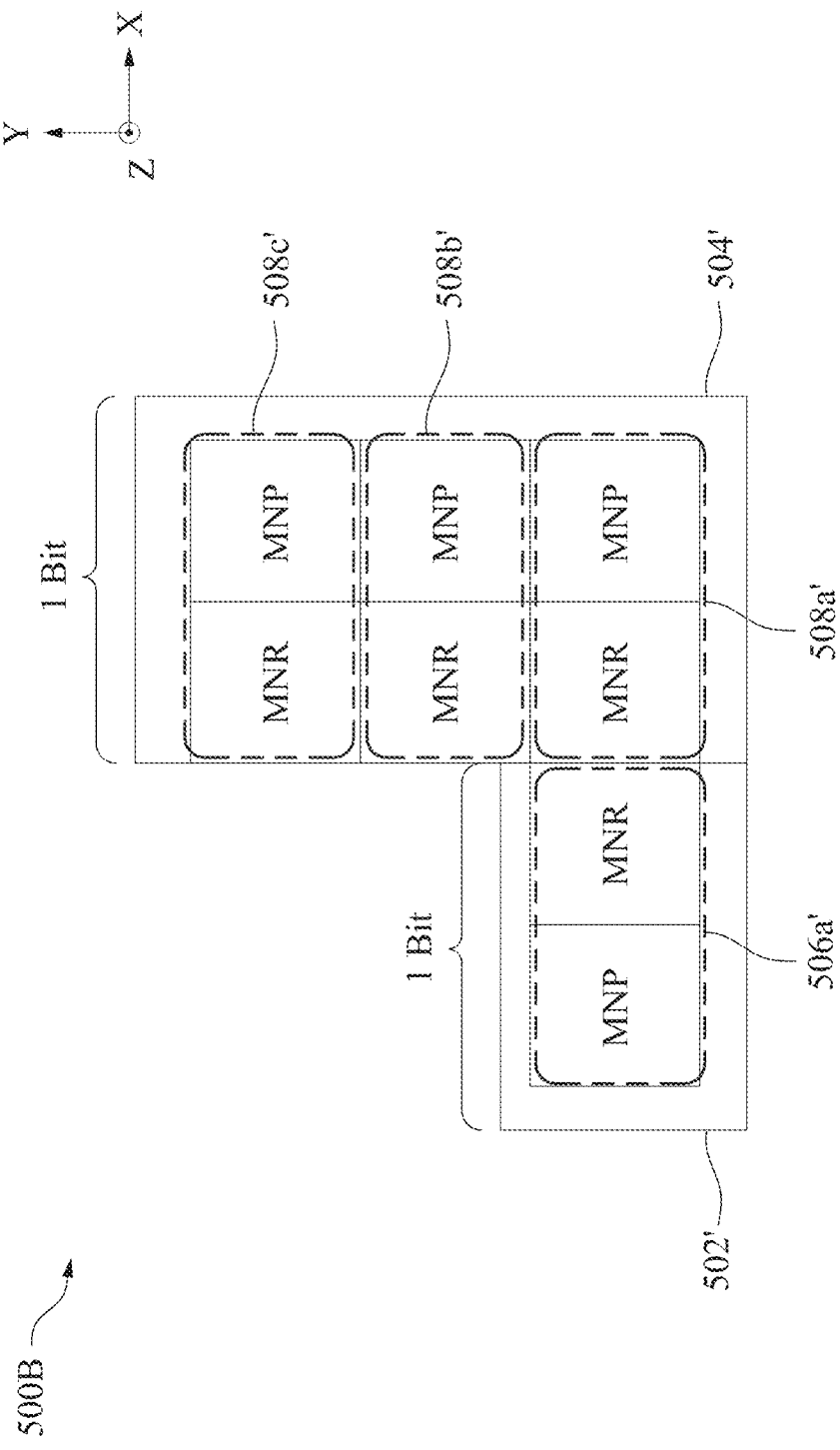
Figure 5C:
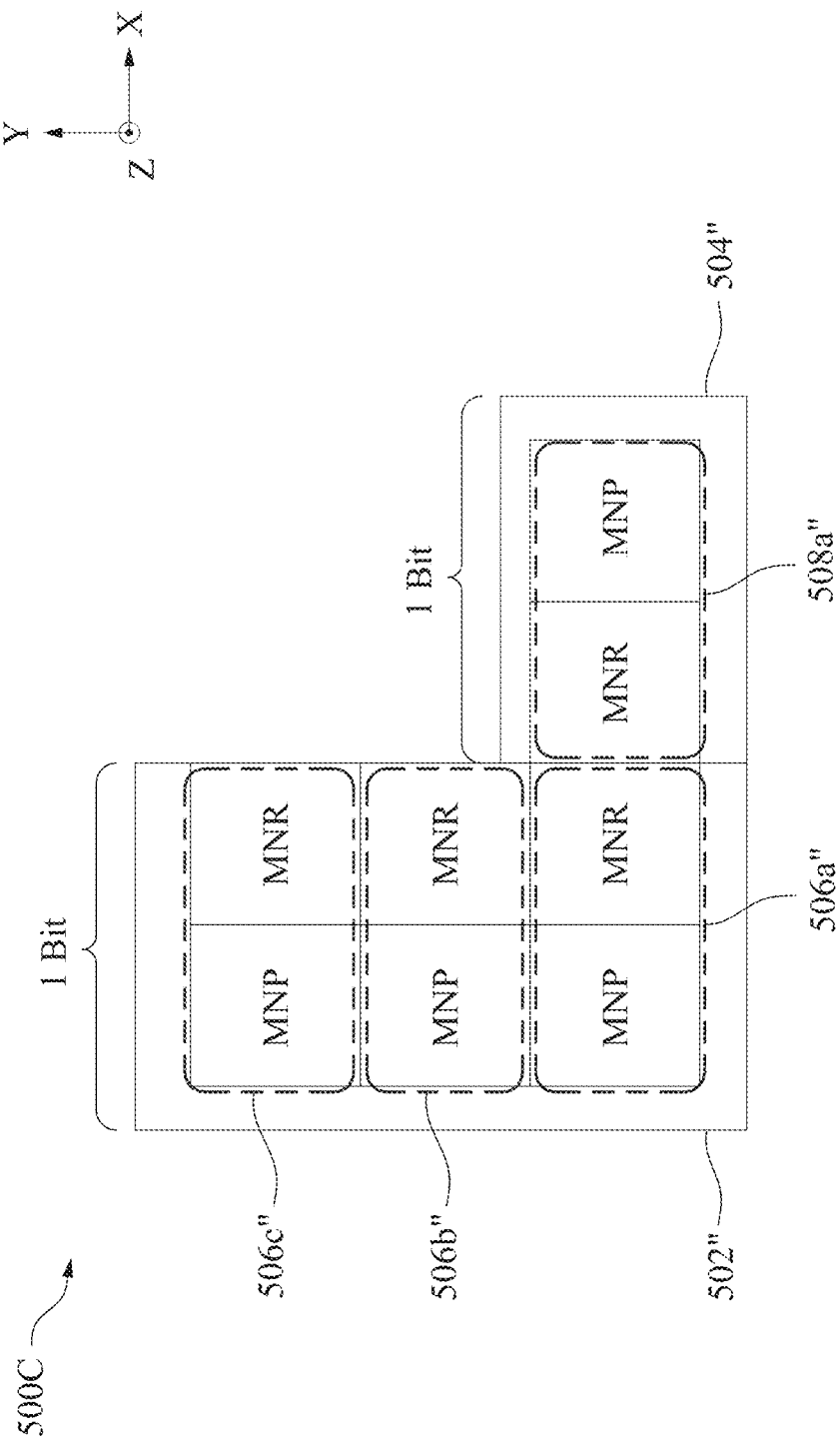

FIGS. 5A-5C are schematic diagrams of a layout design, in accordance with some embodiments.

FIG. 5A is a schematic diagram of a layout design 500A of a memory cell, in accordance with some embodiments. FIG. 5B is a schematic diagram of a layout design 500B of a memory cell, in accordance with some embodiments. FIG. 5C is a schematic diagram of a layout design 500C of a memory cell, in accordance with some embodiments. For ease of illustration, FIGS. 5A-5C include additional elements not shown.

Layout design 500A is another illustration of layout design 400 of FIGS. 4A-4C. For example, in comparison with layout design 400 of FIGS. 4A-4C, layout design 500A is similar to layout design 400, but the layout patterns of FIGS. 4A-4C are not shown in layout design 500A for ease of illustration. Layout design 500A includes a memory cell region 502 and a memory cell region 504. In some embodiments, memory cell regions 502 and 504 are similar to corresponding memory cell regions 401 and 401', and similar detailed description is therefore omitted. In some embodiments, a number of regions (506a, 506b) in memory cell region 502 is equal to a number of regions (508a, 508b) in memory cell region 504.

Memory cell region 502 includes region 506a and region 506b. In some embodiments, regions 506a and 506b are similar to corresponding regions 406a and 406b, and similar detailed description is therefore omitted. In some embodiments, each of region 506a and region 506b includes a corresponding program transistor region MNP and a corresponding read transistor region MNR.

As shown in FIG. 5A, memory cell region 502 is a portion of a layout design usable to manufacture memory cell 202 (FIG. 2A) configured to store 1 bit of data, and having 2 program transistors (MNP or NMOS transistors N1-0 and N2-0) and 2 read transistors (MNR or NMOS transistors N3-0 and N4-0).

Memory cell region 504 includes region 508a and region 508b. In some embodiments, regions 508a and 508b are similar to corresponding regions 408a and 408b, and similar detailed description is therefore omitted. In some embodiments, each of region 508a and region 508b includes a corresponding program transistor region MNP and a corresponding read transistor region MNP.

As shown in FIG. 5A, memory cell region 504 is a portion of a layout design usable to manufacture memory cell 204 (FIG. 2) configured to store 1 bit of data, and having 2 program transistors (MNP or NMOS transistors N1-1 and N2-1) and 2 read transistors (MNR or NMOS transistors N3-1 and N4-1).

In some embodiments, a number of program transistor regions MNP in at least region 506a, 506b, 508a or 508b is equal to a number of read transistor regions MNR in at least region 506a, 506b, 508a or 508b. In some embodiments, a number of program transistor regions MNP in at least region 506a, 506b, 508a or 508b is different from a number of read transistor regions MNR in at least region 506a, 506b, 508a or 508b.

In some embodiments, a number of program transistor regions MNP in at least region 506a, 506b, 508a or 508b is equal to a number of program transistor regions MNP in another of region 506a, 506b, 508a or 508b. In some embodiments, a number of program transistor regions MNP in at least 506a, 506b, 508a or 508b is different from a number of program transistor regions MNP in another of region 506a, 506b, 508a or 508b.

In some embodiments, a number of read transistor regions MNR in at least region 506a, 506b, 508a or 508b is equal to a number of read transistor regions MNR in another of region 506a, 506b, 508a or 508b. In some embodiments, a number of read transistor regions MNR in at least region 506a, 506b, 508a or 508b is different from a number of read transistor regions MNR in another of region 506a, 506b, 508a or 508b.

FIG. 5B is a schematic diagram of a layout design 500B of memory cell array 200B, in accordance with some embodiments.

In some embodiments, layout design 500B illustrates a number of regions (506a') in memory cell region 502' is different than a number of regions (508a', 508b', 508c') in memory cell region 504'. In some embodiments, a number of regions (506a') in memory cell region 502' is less than a number of regions (508a', 508b', 508c') in memory cell region 504'. In some embodiments, a number of regions (506a') in memory cell region 502' is greater than a number of regions (508a', 508b', 508c') in memory cell region 504'.

In some embodiments, by having other numbers of regions in memory cell region 502' and memory cell region 504', layout design 500B offers a more flexible design than other approaches.

Layout design 500B is a variation of layout design 400 of FIGS. 4A-4C and layout design 500A of FIG. 5A. In comparison with layout design 500A, memory cell region 502' replaces memory cell region 502, memory cell region 504' replaces memory cell region 504, and similar detailed description is therefore omitted.

Memory cell region 502' includes a region 506a'. Region 506a' is a variation of region 506a of FIG. 5A. In some embodiments, region 506a' is similar to region 506a or 406a, and similar detailed description is therefore omitted.

As shown in FIG. 5B, memory cell region 502' is a portion of a layout design usable to manufacture a memory cell, similar to memory cell 202' of memory cell array 200B of FIG. 2B, the memory cell configured to store 1 bit of data, and having 1 program transistor (MNP or NMOS transistor N1-0) and 1 read transistor (MNR or NMOS transistor N3-0).

Other numbers of regions is within the scope of the present disclosure. For example, in some embodiments, memory cell region 502' includes a number of regions different from 1 region (e.g., region 506a').

Memory cell region 504' includes a region 508a', a region 508b', a region 508c'. Regions 508a' and 508b' are a variation of corresponding regions 508a and 508b of FIG. 5A. In some embodiments, region 508a' is similar to region 508a or 408a, region 508b' is similar to region 508b or 408b, region 508c' is similar to region 508a or 508b, and similar detailed description is therefore omitted.

As shown in FIG. 5B, memory cell region 504' is a portion of a layout design usable to manufacture memory cell 204' configured to store 1 bit of data, and having 3 program transistors (MNR or NMOS transistors N1-1, N2-1, N5-1) and 3 read transistors (NMOS transistors N3-1, N4-1, N6-1).

Other numbers of regions is within the scope of the present disclosure. For example, in some embodiments, memory cell region 504' includes a number of regions different from 3 regions (e.g., region 508a', region 508b' or region 508c').

In some embodiments, each of region 506a', 508a', 508b' and 508c' includes a corresponding program transistor region MNP and a corresponding read transistor region MNP.

In some embodiments, a number of program transistor regions MNP or a number of read transistor regions MNR in at least region 506a', 508a', 508b' or 508c' can be adjusted similar to the description above for FIG. 5A, and is therefore omitted for brevity.

FIG. 5C is a schematic diagram of a layout design 500C of memory cell array 200C, in accordance with some embodiments.

Layout design 500B is a variation of layout design 500B of FIG. 5B. In some embodiments, layout design 500C illustrates a number of regions (e.g., 506a", 506b", 506c") in memory cell region 502" to be greater than a number of regions (508a") in memory cell region 504", and similar detailed description is therefore omitted for brevity.

In comparison with layout design 500A, memory cell region 502" replaces memory cell region 502, memory cell region 504" replaces memory cell region 504, regions 506a", 506b" replace corresponding regions 506a, 506b, region 508a" replaces region 508a, region 506c" is similar to region 502a, and similar detailed description is therefore omitted.

In some embodiments, by having other numbers of regions in memory cell region 502" and memory cell region 504", layout design 500C offers a more flexible design than other approaches.

Other configurations, arrangements on other layout levels or quantities of in layout design 500A, 500B or 500C are within the scope of the present disclosure.

Figure 6:
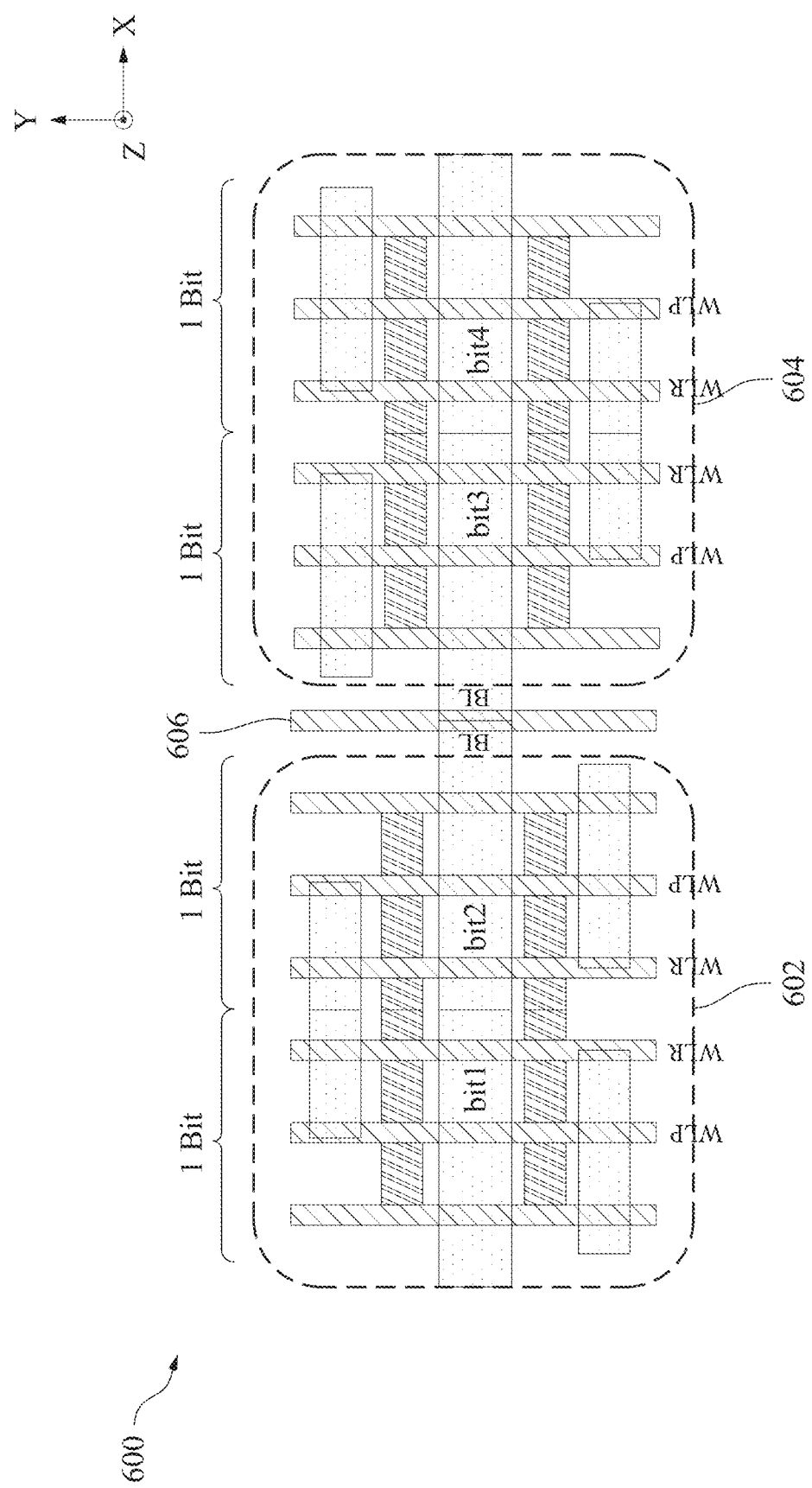
FIG. 6 is a schematic diagram of a layout design, in accordance with some embodiments.

FIG. 6 is a schematic diagram of a layout design 600, in accordance with some embodiments.

In some embodiments, layout design 600 of FIG. 6 illustrates includes a pair of adjacent layout designs (e.g., first layout design 602, a second layout design 604) useable to manufacture a 4 adjacent memory cells in a same row.

Layout design 600A is a variation of layout design 400 of FIGS. 4A-4C. For example, in comparison with layout design 400 of FIGS. 4A-4C, layout design 600 includes an additional layout design (e.g., second layout design 604). For ease of illustration, FIG. 6 includes additional elements not shown.

Layout design 600 includes a first layout design 602, a second layout design 604 and a gate layout pattern 606.

In some embodiments, first layout design 602 corresponds to layout design 400 of FIGS. 4A-4C, and similar detailed description is therefore omitted.

In some embodiments, second layout design 604 is similar to first layout design 602, and similar detailed description is therefore omitted. For example, in some embodiments, second layout design 604 is a mirror image of layout design 602 that is rotated about the x-axis.

Gate layout pattern 606 is similar to at least a gate layout pattern of the set of gate layout patterns 404 of FIGS. 4A-4C, and similar detailed description is therefore omitted. Gate layout pattern 606 is positioned between the first layout design 602 and second layout design 604.

In some embodiments, layout design 600 is useable to manufacture 4 adjacent memory cells in memory cell array 300 positioned in a same row. For example, in some embodiments, first layout design 602 is usable to manufacture memory cells 302[0,0] and 302[0,1], and second layout design 604 is usable to manufacture memory cells 302[0,2] and 302[0,3]. In some embodiments, first layout design 602 is usable to manufacture memory cells other than memory cells 302[0,0] and 302[0,1] in memory cell array 300, and second layout design 604 is usable to manufacture memory cells other than memory cells 302[0,2] and 302[0,3] in memory cell array 300.

Other configurations, arrangements on other layout levels or quantities of in layout design 600 are within the scope of the present disclosure.

Integrated Circuit

Figure 7C:
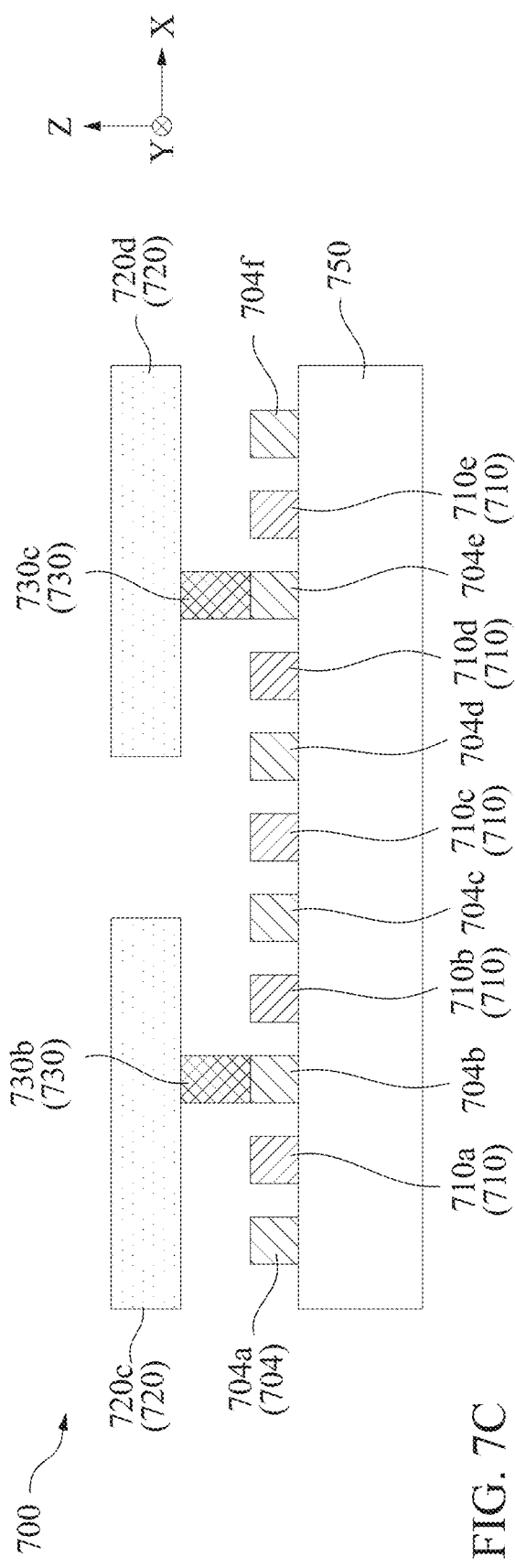
Figure 7D:
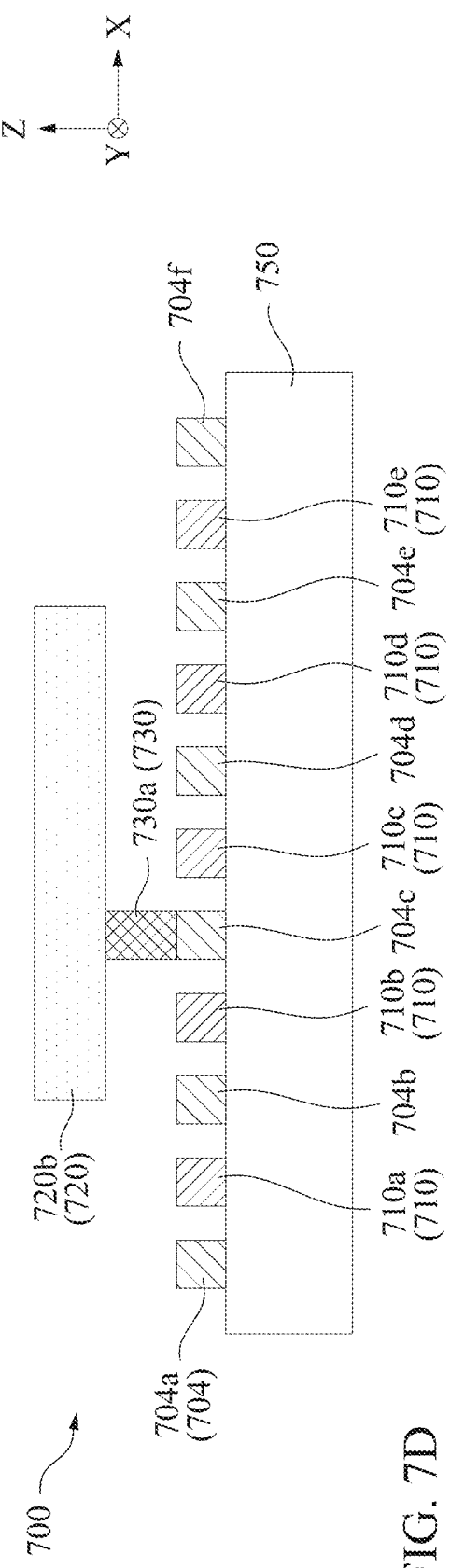
Figure 7E:
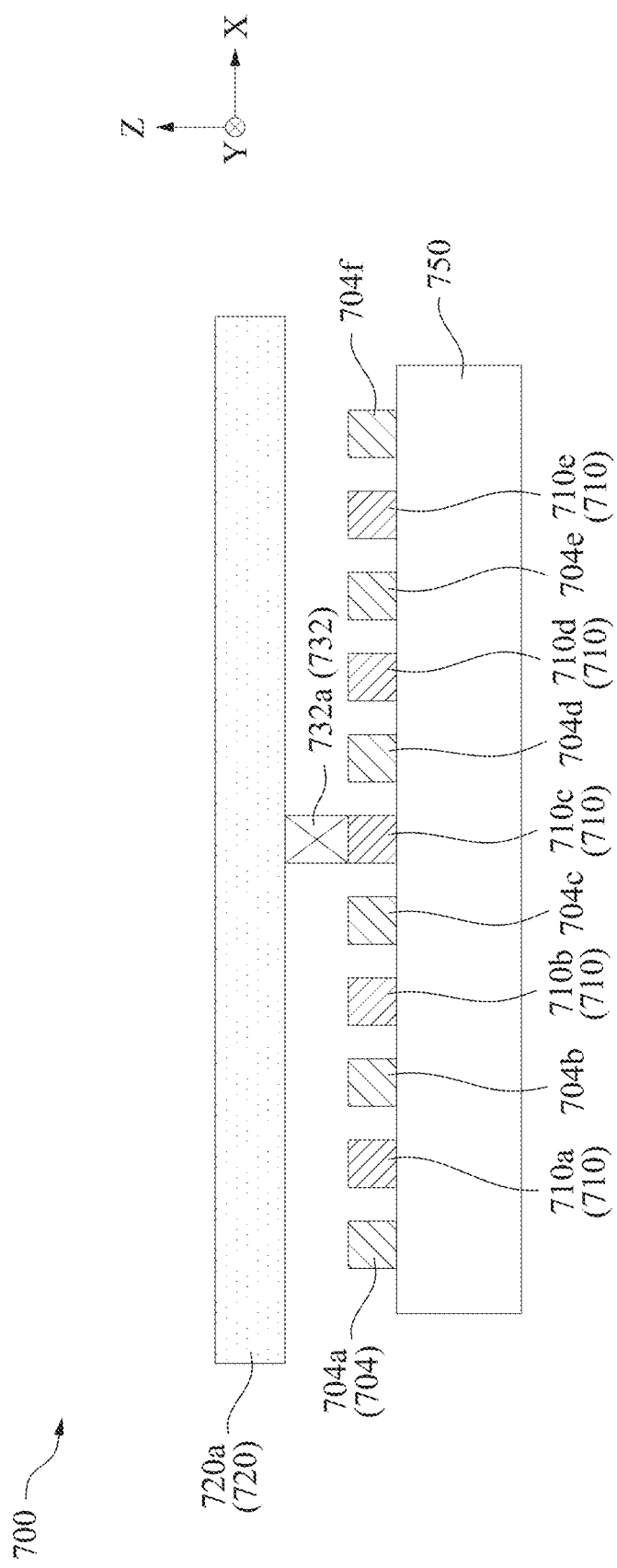

FIGS. 7A, 7B, 7C, 7D and 7E are cross-sectional views of an integrated circuit 700, in accordance with some embodiments. FIG. 7A is a cross-sectional view of integrated circuit 700 corresponding to layout design 400 as intersected by plane A-A', FIG. 7B is a cross-sectional view of integrated circuit 700 corresponding to layout design 400 as intersected by plane B-B', FIG. 7C is a cross-sectional view of integrated circuit 700 corresponding to layout design 400 as intersected by plane C-C', FIG. 7D is a cross-sectional view of integrated circuit 700 corresponding to layout design 400 as intersected by plane D-D', and FIG. 7E is a cross-sectional view of integrated circuit 700 corresponding to layout design 400 as intersected by plane E-E', in accordance with some embodiments. Integrated circuit 700 is manufactured by layout design 400 or 600.

Components that are the same or similar to those in one or more of FIGS. 1A-1B, 2-3, 4A-4C, 5A-5C and 6 are given the same reference numbers, and detailed description thereof is thus omitted.

Integrated circuit 700 is manufactured by layout design 400 or 600. Structural relationships including alignment, lengths and widths, as well as configurations of integrated circuit 700 of FIGS. 7A-7E are similar to the structural relationships and configurations of memory cell 100A of FIG. 1A, memory cell array 200A-200C of FIGS. 2A-2C, memory cell array 300 of FIG. 3, layout design 400 of FIGS. 4A-4C, layout designs 500A-500C of FIGS. 5A-5C, and layout design 600 of FIG. 6 and will not be described in each of FIG. 1A, 2-3, 4A-4C or 5A-5C for brevity.

Integrated circuit 700 includes at least active region 712a, 712b, 712c, 712d or 712e (collectively referred to as a "set of active regions 712") in a well region 702a. In some embodiments, well region 702a is in a substrate 750. In some embodiments, substrate 750 includes a silicon substrate or a substrate of any other applicable semiconductor materials. In some embodiments, well region 702a includes a p-type dopant or an n-type dopant.

The set of active regions 712 extends in the second direction Y and is located on the first layout level of integrated circuit 700. Each active region of the set of active regions 712 is separated from each other in the first direction X. In some embodiments, set of active regions 712 of integrated circuit 700 is referred to as an oxide definition (OD) region which defines the source or drain diffusion regions of integrated circuit 700. In some embodiments, the set of active regions 712 includes an n-type dopant in well region 702a (e.g., p-type), and corresponds to source or drain regions of NMOS transistors N2-0, N2-1, N4-0 or N4-1 of FIG. 2. In some embodiments, the set of active regions 712 includes a p-type dopant in well region 702a (e.g., n-type), and correspond to source or drain regions of PMOS transistors (not shown) similar to NMOS transistors N2-0, N2-1, N4-0 or N4-1 of FIG. 2. Other quantities or configurations of the set of active region 712 are within the scope of the present disclosure.

Integrated circuit 700 includes at least active region 714a, 714b, 714c, 714d or 714e (collectively referred to as a "set of active regions 714") in a well region 702b. In some embodiments, well region 702b is in substrate 750. In some embodiments, well region 702b includes an n-type dopant or a p-type dopant.

The set of active regions 714 extends in the second direction Y and is located on the first layout level of integrated circuit 700. Each active region of the set of active regions 714 is separated from each other in the first direction X. In some embodiments, set of active regions 714 of integrated circuit 700 is referred to as an OD region which defines the source or drain diffusion regions of integrated circuit 700. In some embodiments, the set of active regions 714 includes an n-type dopant in well region 702b (e.g., p-type), and corresponds to source or drain regions of NMOS transistors N1-0, N1-1, N3-0 or N3-1 of FIG. 2. In some embodiments, the set of active regions 714 includes a p-type dopant in well region 702b (e.g., n-type), and corresponds to source or drain regions of PMOS transistors (not shown) similar to NMOS transistors N1-0, N1-1, N3-0 or N3-1 of FIG. 2. Other quantities or configurations of the set of active region 714 are within the scope of the present disclosure.

Integrated circuit 700 further includes at least a gate oxide layer 760 extending in the first direction X. In some embodiments, the gate oxide layer 760 covers a top surface of the well region 750. In some embodiments, the gate oxide layer 760 includes an insulating material, a dielectric material or the like.

Integrated circuit 700 further includes at least gate 704a, 704b, 704c, 704d, 704e or 704f (collectively referred to as "set of gates 704") extending in the second direction Y, overlapping at least the gate oxide layer 760, and is located on the second layout level of integrated circuit 700. In some embodiments, the set of gates 704 overlaps the set of active regions 712 and 714.

Each of the gates of the set of gates 704 is separated from an adjacent gate of the set of gates 404 in the second direction Y by a poly pitch (not shown).

Gate 704b corresponds to the gate of NMOS transistors N1-0 and N2-0 of FIG. 3. Gate 704c corresponds to the gate of NMOS transistors N3-0 and N4-0 of FIG. 3. Gate 704d corresponds to the gate of NMOS transistors N3-1 and N4-1 of FIG. 3. Gate 704e corresponds to the gate of NMOS transistors N1-1 and N2-1 of FIG. 3. In some embodiments, at least gate 704a or 704f is configured as a dummy gate as part of a dummy transistor. In some embodiments, a dummy transistor is a non-functional transistor.

In some embodiments, gate 704b is at least program word line WLP of FIG. 1A, program word line WLP0 of FIG. 2 or program word lines WLP' of FIG. 3. In some embodiments, gate 704c is at least read word line WLR of FIG. 1A, read word line WLR0 of FIG. 2 or read word lines WLR' of FIG. 3. In some embodiments, gate 704d is at least read word line WLR of FIG. 1A, read word line WLR1 of FIG. 2 or read word lines WLR' of FIG. 3. In some embodiments, gate 704e is at least program word line WLP of FIG. 1A, program word line WLP1 of FIG. 2 or program word lines WLP' of FIG. 3.

Other quantities or configurations of the set of gates 704 are within the scope of the present disclosure.

Integrated circuit 700 further includes at least contact 710a, 710b, 710c, 710d or 710e (collectively referred to as a "set of contacts 710") extending in the second direction Y, overlapping the set of active regions 712 and 714, and being located on the third layout level of integrated circuit 700.

In some embodiments, each of contacts 710a, 710b, 710c, 710d, 710e of the set of contacts 710 is separated from an adjacent contact of the set of contacts 710 in at least the first direction X.

In some embodiments, contact 710a electrically couples active regions 712a and 714a. In some embodiments, contact 710a is a source or drain terminal of NMOS transistor N1-0 and a source or drain terminal of NMOS transistor N2-0 of FIG. 2.

In some embodiments, contact 710b electrically couples active regions 712b and 714b. In some embodiments, contact 710b is a source or drain terminal of NMOS transistor N1-0, a source or drain terminal of NMOS transistor N2-0, a source or drain terminal of NMOS transistor N3-0 or a source or drain terminal of NMOS transistor N4-0 of FIG. 2.

In some embodiments, contact 710c electrically couples active regions 712c and 714c. In some embodiments, contact 710c is a source or drain terminal of NMOS transistor N3-1, a source or drain terminal of NMOS transistor N4-1, a source or drain terminal of NMOS transistor N3-0 or a source or drain terminal of NMOS transistor N4-0 of FIG. 2.

In some embodiments, contact 710d electrically couples active regions 712d and 714d. In some embodiments, contact 710d is a source or drain terminal of NMOS transistor N3-1, a source or drain terminal of NMOS transistor N4-1, a source or drain terminal of NMOS transistor N1-1 or a source or drain terminal of NMOS transistor N2-1 of FIG. 2.

In some embodiments, contact 710d electrically couples active regions 712d and 714d. In some embodiments, contact 710d is a source or drain terminal of NMOS transistor N2-1 and a source or drain terminal of NMOS transistor N1-1 of FIG. 2.

Other quantities or configurations of the set of contacts 710 are within the scope of the present disclosure.

Integrated circuit 700 further includes at least conductive structure 720a, 720b, 720c or 720d (collectively referred to as a "set of conductive structures 720") extending in at least the first direction X. The set of conductive structures 720 is located on the fourth layout level. In some embodiments, the fourth layout level of integrated circuit 700 is metal zero (M0) level. In some embodiments, the M0 level is positioned above at least the active region, the POLY level or the MD level of integrated circuit 700. Other layout levels are within the scope of the present disclosure.

In some embodiments, conductive structure 720a is at least bit line BL0 of FIG. 2, bit line BL of FIG. 1A or bit lines BL' of FIG. 3.

The set of conductive structures 720 overlaps at least the set of gates 704 or the set of contacts 710. In some embodiments, conductive structure pattern 720a overlaps each of the gates in the set of gate layout patterns 404 and each of the contacts in the set of contacts 710.

Conductive structure 720b overlaps gates 704b, 704c, 704d and 704e and contacts 710b, 710c and 710d. Conductive structure 720c overlaps gates 704a, 704b and 704c and contacts 710a and 710b. Conductive structure 720d overlaps gates 704d, 704e and 704f and contacts 710d and 710e.

Other quantities or configurations of the set of conductive structures 720 are within the scope of the present disclosure.

Integrated circuit 700 further includes at least via 730a, 730b or 730c (collectively referred to as a "set of vias 730") extending in a third direction Z.

In some embodiments, set of vias 730 electrically couples at least one conductive structure of the set of conductive structures 720 to at least one gate of the set of gates 704.

In some embodiments, the set of vias 730 are between the set of conductive structures 720 and the set of gates 704. Via 730a, 730b, 730c is between corresponding conductive structure 720b, 720c, 720d and corresponding gate 704c, 704b, 704e. In some embodiments, via 730a, 730b, 730c is located where a corresponding conductive structure 720b, 720c, 720d overlaps corresponding gate 704c, 704b, 704e.

Set of vias 730 are positioned at the VG level of integrated circuit 700. Other layout levels are within the scope of the present disclosure.

In some embodiments, conductive structure 720b, 720c, 720d is electrically coupled to corresponding gate 704c, 704b, 704e by corresponding via 730a, 730b, 730c.

Other configurations, arrangements on other layout levels or quantities of vias in the set of vias 730 are within the scope of the present disclosure.

Integrated circuit 700 further includes at least a via 732a (collectively referred to as a "set of vias 732") extending in the third direction Z.

In some embodiments, set of vias 732 electrically couples at least one conductive structure of the set of conductive structures 720 to at least one contact of the set of contacts 710. In some embodiments, conductive structure 720a is electrically coupled to contact 710c by via 732a.

In some embodiments, the set of vias 732 are between the set of conductive structures 720 and the set of contacts 710. Via 732a is between conductive structure 720a and contact 710c. In some embodiments, via 732a is located where conductive structure 720a overlaps contact 710c.

Set of vias 732 are positioned at the VD level of integrated circuit 700. Other layout levels are within the scope of the present disclosure.

Other configurations, arrangements on other layout levels or quantities of vias in the set of vias 732 are within the scope of the present disclosure.

In some embodiments, at least gate 704a, gate 704b, gate 704c, active region 712a, active region 712b, a portion of active region 712c, active region 714a, active region 714b, a portion of active region 714c, contact 710a, contact 710b, a portion of contact 710c, via 730a, via 730b, via 730c, via 732a, conductive structure 720a, conductive structure 720b or conductive structure 720c are part of a memory cell 790a.

In some embodiments, at least gate 704d, gate 704e, gate 704f, a portion of active region 712c, active region 712d, active region 712e, a portion of active region 714c, active region 714d, active region 714e, a portion of contact 710c, contact 710d, contact 710e, via 730c, via 732a, conductive structure 720a or conductive structure 720d are part of a memory cell 790b.

In some embodiments, memory cells 790a and 790b are similar to corresponding memory cells 202 and 204 of FIG. 2, or corresponding memory cells 302[0,0] and 302[0,1] of FIG. 3, and similar detailed description is therefore omitted.

Method

Figure 8:
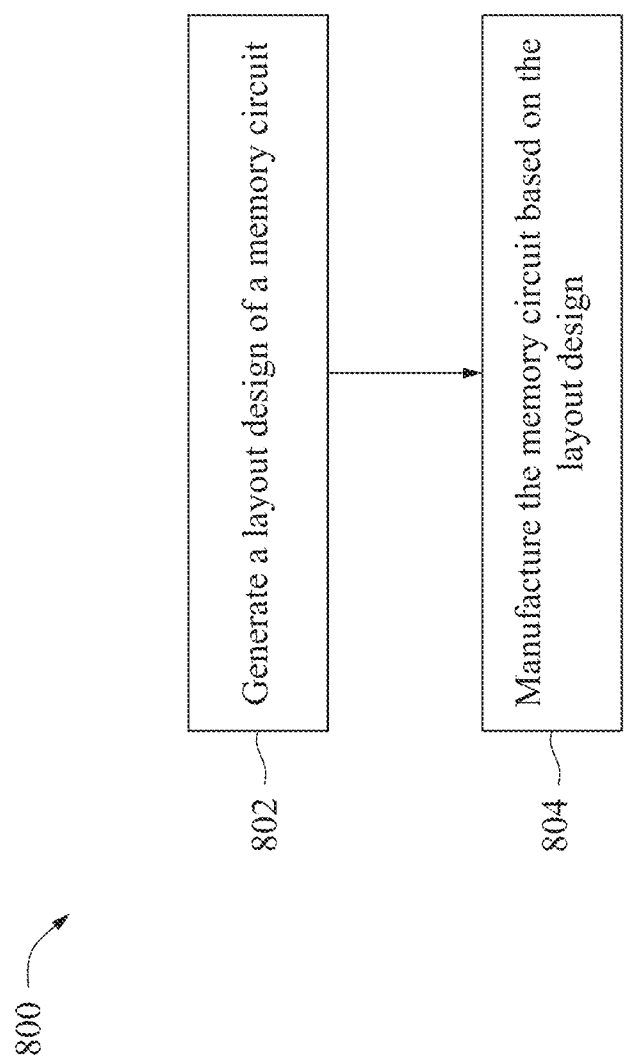
FIG. 8 is a flowchart of a method of forming or manufacturing a memory circuit in accordance with some embodiments.

FIG. 8 is a flowchart of a method 800 of forming or manufacturing a memory circuit in accordance with some embodiments. It is understood that additional operations may be performed before, during, and/or after the method 800 depicted in FIG. 8, and that some other operations may only be briefly described herein. In some embodiments, the method 800 is usable to form memory circuits, such as memory cell 100A (FIG. 1A), memory cell array 200A-200C (FIGS. 2A-2C) or at least one memory cell in array of cells 302 (FIG. 3) or integrated circuits, such as integrated circuit 700 (FIG. 7). In some embodiments, the method 800 is usable to form integrated circuits having similar structural relationships as one or more of layout design 400 (FIG. 4) or 600 (FIG. 6), or layout design 500A-500C (FIGS. 5A-5C).

In operation 802 of method 800, a layout design of a memory circuit is generated. Operation 802 is performed by a processing device (e.g., processor 1002 (FIG. 10)) configured to execute instructions for generating a layout design. In some embodiments, the layout design of method 800 includes one or more of layout design 400 or 600. In some embodiments, the layout design of the present application includes features similar to FIGS. 5A-5C. In some embodiments, the layout design of the present application is in a graphic database system (GDSII) file format.

In operation 804 of method 800, the memory circuit is manufactured based on the layout design. In some embodiments, operation 804 of method 800 comprises manufacturing at least one mask based on the layout design, and manufacturing the memory circuit based on the at least one mask.

In some embodiments, layout design 400, 500A-500C or 600 is a standard cell. In some embodiments, one or more of operations 802 or 804 is not performed.

Figure 9:
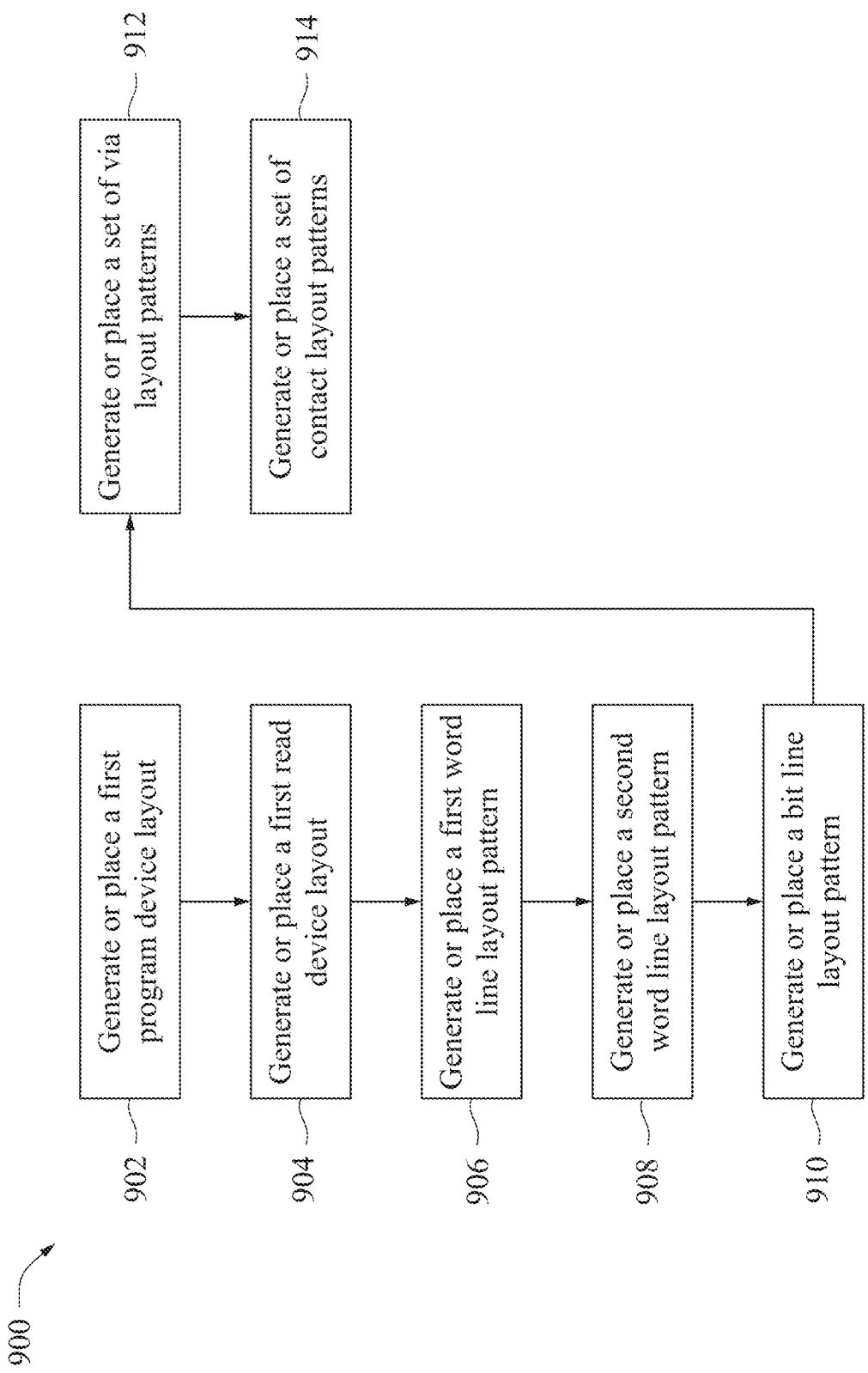
FIG. 9 is a flowchart of a method of generating a layout design of a memory circuit in accordance with some embodiments.

FIG. 9 is a flowchart of a method 900 of generating a layout design of an integrated circuit in accordance with some embodiments. It is understood that additional operations may be performed before, during, and/or after the method 900 depicted in FIG. 9, and that some other processes may only be briefly described herein. In some embodiments, method 900 is an embodiment of operation 802 of method 800. In some embodiments, the method 900 is usable to generate one or more layout patterns of layout design 400, 500A-500C or 600 of a memory circuit (e.g., memory cell 100A, memory cell array 200A-200C, at least one memory cell of array of cells 302 of memory cell array 300, or an integrated circuit (e.g., integrated circuit 700).

In operation 902 of method 900, a first program device layout is generated or placed. In some embodiments the first program device layout includes at least region 406a, 406b, 408a or 408b. In some embodiments, generating the first program device layout comprises generating a first transistor layout design corresponding to fabricating a first transistor of the first program device, and generating a second transistor layout design corresponding to fabricating a second transistor of the first program device. In some embodiments, the first transistor of the first program device of operation 902 includes at least NMOS transistor N1-0, N2-0, N1-1 or N2-1. In some embodiments, the first transistor and the second transistor of method 900 are configured to share a first gate and are coupled in parallel with each other. In some embodiments, operation 902 is repeated for each region (406a, 406b, 408a, 408b) having a transistor layout design as shown in FIGS. 4A-4C. In some embodiments, operation 902 is repeated for other program device layouts having corresponding transistor layout designs as shown in FIGS. 4A-4C.

In operation 904 of method 900, a first read device layout is generated or placed. In some embodiments the first read device layout includes at least region 406a, 406b, 408a, 408b. In some embodiments, generating the first read device layout comprises generating a third transistor layout design corresponding to fabricating a third transistor of the first read device, and generating a fourth transistor layout design corresponding to fabricating a fourth transistor of the first read device. In some embodiments, the third transistor of the first read device of operation 904 includes at least NMOS transistor N3-0, N4-0, N3-1 or N4-1. In some embodiments, the third transistor and the fourth transistor of method 900 are configured to share a second gate and are coupled in parallel with each other. In some embodiments, the first read device layout is adjacent to the first read device layout. In some embodiments, operation 904 is repeated for each region (406a, 406b, 408a, 408b) having a transistor layout design as shown in FIGS. 4A-4C. In some embodiments, operation 904 is repeated for other program device layouts having corresponding transistor layout designs as shown in FIGS. 4A-4C.

In some embodiments, at least operation 902 or 904 further comprises generating or placing a first active region layout pattern and a second active region layout pattern extending in the first direction X, being located on the first layout level, and being separated from one another in the second direction Y. In some embodiments, the first active region layout pattern of operation 902 or 904 includes active region layout pattern 402a or 402b. In some embodiments, the second active region layout pattern of operation 902 or 904 includes active region layout pattern 402a or 402b.

In operation 906 of method 900, a first word line layout pattern is generated or placed on layout design 400 or 600. In some embodiments, the first word line layout pattern includes at least one of the set of gate layout patterns 402.

In operation 908 of method 900, a second word line layout pattern is generated or placed on layout design 400 or 600. In some embodiments, the second word line layout pattern includes at least one of the set of gate layout patterns 402.

In operation 910 of method 900, a bit line layout pattern is generated or placed on layout design 400 or 600. In some embodiments, the bit line layout pattern includes at least one of the set of conductive feature layout patterns 420. In some embodiments, operation 910 comprises generating or placing a set of conductive feature layout patterns. In some embodiments the set of conductive feature layout patterns of operation 910 includes the set of conductive feature layout patterns 420.

In operation 912 of method 900, a set of via layout patterns is generated or placed on layout design 400 or 600. In some embodiments, the set of via layout patterns includes at least one of the set of via layout patterns 430 or 432.

In operation 914 of method 900, a set of metal over diffusion layout patterns is generated or placed on layout design 400 or 600. In some embodiments, the set of metal over diffusion layout patterns includes at least one of the set of metal over diffusion layout patterns 410.

In some embodiments, one or more of operations 902, 904, 906, 908, 910, 912 or 914 is not performed.

One or more of the operations of methods 800-900 is performed by a processing device configured to execute instructions for manufacturing a memory circuit, such as memory cell 100A, memory cell array 200A-200C or at least one memory cell of array of cells 302 of memory cell array 300, or an integrated circuit, such as integrated circuit 700.

In some embodiments, one or more operations of methods 800-900 is performed using a same processing device as that used in a different one or more operations of methods 800-900. In some embodiments, a different processing device is used to perform one or more operations of methods 800-900 from that used to perform a different one or more operations of methods 800-900.

Figure 10:
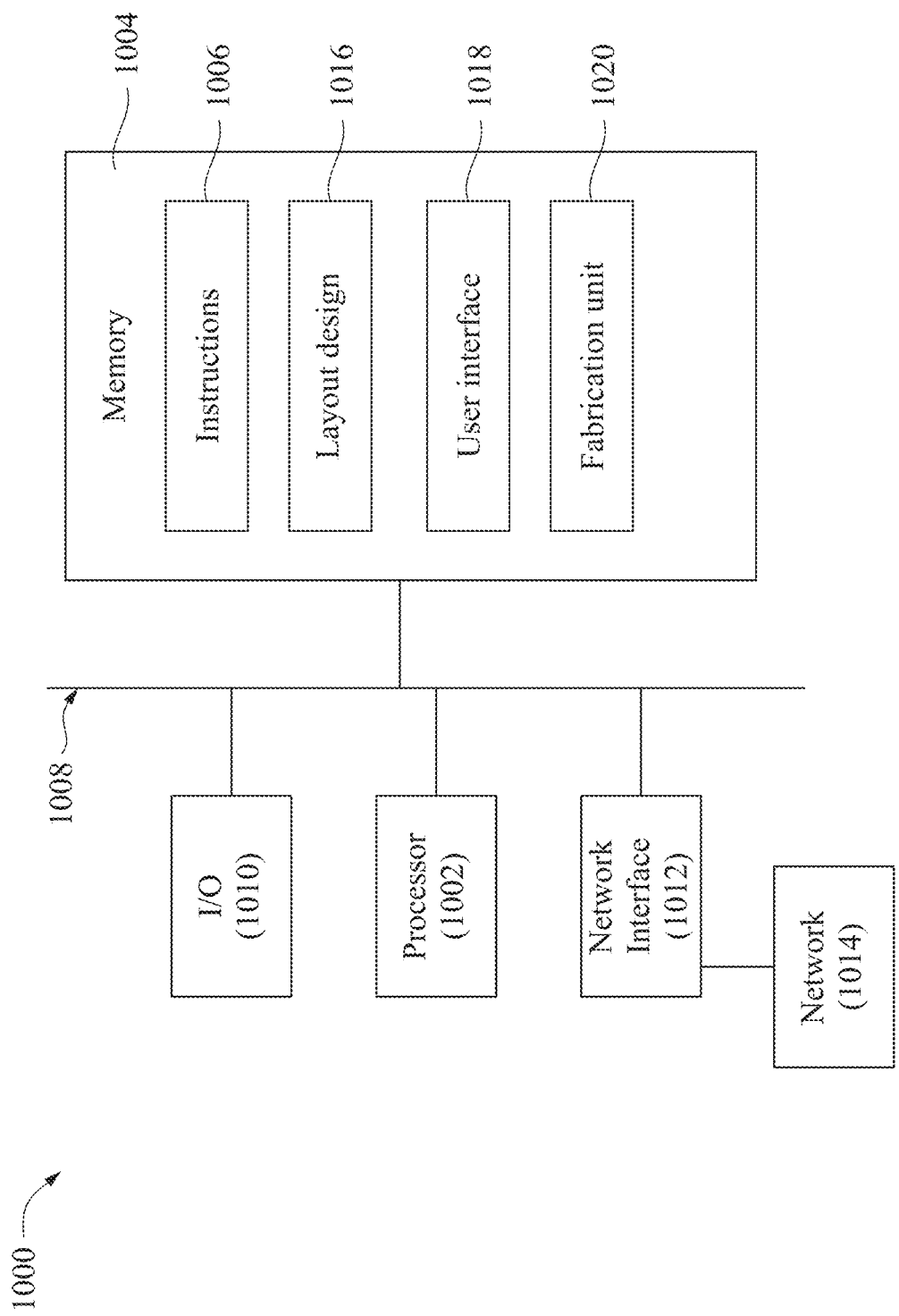
FIG. 10 is a schematic view of a system for designing an IC layout design in accordance with some embodiments.

FIG. 10 is a schematic view of a system 1000 for designing and manufacturing an IC layout design in accordance with some embodiments. In some embodiments, system 1000 generates or places one or more IC layout designs described herein. In some embodiments, system 1000 manufactures one or more ICs based on the one or more IC layout designs described herein. System 1000 includes a hardware processor 1002 and a non-transitory, computer readable storage medium 1004 encoded with, i.e., storing, the computer program code 1006 (used interchangeably with "Instructions" and labelled in FIG. 10 as "Instructions 1006"), i.e., a set of executable instructions. Computer readable storage medium 1004 is configured for interfacing with manufacturing machines for producing the integrated circuit. The processor 1002 is electrically coupled to the computer readable storage medium 1004 by a bus 1008. The processor 1002 is also electrically coupled to an I/O interface 1010 by bus 1008. A network interface 1012 is also electrically connected to the processor 1002 by bus 1008. Network interface 1012 is connected to a network 1014, so that processor 1002 and computer readable storage medium 1004 are capable of connecting to external elements via network 1014. The processor 1002 is configured to execute the computer program code 1006 encoded in the computer readable storage medium 1004 in order to cause system 1000 to be usable for performing a portion or all of the operations as described in method 800 or 900.

In some embodiments, the processor 1002 is a central processing unit (CPU), a multi-processor, a distributed processing system, an application specific integrated circuit (ASIC), and/or a suitable processing unit.

In some embodiments, the computer readable storage medium 1004 is an electronic, magnetic, optical, electromagnetic, infrared, and/or a semiconductor system (or apparatus or device). For example, the computer readable storage medium 1004 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1004 includes a compact disk-read only memory (CD-ROM), a compact disk-read/write (CD-R/W), and/or a digital video disc (DVD).

In some embodiments, the storage medium 1004 stores the computer program code 1006 configured to cause system 1000 to perform method 800 or 900. In some embodiments, the storage medium 1004 also stores information needed for performing method 800 or 900 as well as information generated during performance of method 800 or 900, such as layout design 1016 and user interface 1018 and fabrication unit 1020, and/or a set of executable instructions to perform the operation of method 800 or 900. In some embodiments, layout design 1016 comprises one or more layout patterns of layout design 400 or 600.

In some embodiments, the storage medium 1004 stores instructions (e.g., computer program code 1006) for interfacing with manufacturing machines. The instructions (e.g., computer program code 1006) enable processor 1002 to generate manufacturing instructions readable by the manufacturing machines to effectively implement method 800 or 900 during a manufacturing process.

System 1000 includes I/O interface 1010. I/O interface 1010 is coupled to external circuitry. In some embodiments, I/O interface 1010 includes a keyboard, keypad, mouse, trackball, trackpad, and/or cursor direction keys for communicating information and commands to processor 1002.

System 1000 also includes network interface 1012 coupled to the processor 1002. Network interface 1012 allows system 1000 to communicate with network 1014, to which one or more other computer systems are connected. Network interface 1012 includes wireless network interfaces such as BLUETOOTH, WIFI, WIMAX, GPRS, or WCDMA; or wired network interface such as ETHERNET, USB, or IEEE-13104. In some embodiments, method 800 or 900 is implemented in two or more systems 1000, and information such as layout design, user interface and fabrication unit are exchanged between different systems 1000 by network 1014.

System 1000 is configured to receive information related to a layout design through I/O interface 1010 or network interface 1012. The information is transferred to processor 1002 by bus 1008 to determine a layout design for producing an IC (e.g., memory cell 100A, memory cell array 200A-200C, at least one memory cell of array of cells 302 of memory cell array 300, or integrated circuit 700). The layout design is then stored in computer readable medium 1004 as layout design 1016. System 1000 is configured to receive information related to a user interface through I/O interface 1010 or network interface 1012. The information is stored in computer readable medium 1004 as user interface 1018. System 1000 is configured to receive information related to a fabrication unit through I/O interface 1010 or network interface 1012. The information is stored in computer readable medium 1004 as fabrication unit 1020. In some embodiments, the fabrication unit 1020 includes fabrication information utilized by system 1000.

In some embodiments, method 800 or 900 is implemented as a standalone software application for execution by a processor. In some embodiments, method 800 or 900 is implemented as a software application that is a part of an additional software application. In some embodiments, method 800 or 900 is implemented as a plug-in to a software application. In some embodiments, method 800 or 900 is implemented as a software application that is a portion of an EDA tool. In some embodiments, method 800 or 900 is implemented as a software application that is used by an EDA tool. In some embodiments, the EDA tool is used to generate a layout design of the integrated circuit device. In some embodiments, the layout design is stored on a non-transitory computer readable medium. In some embodiments, the layout design is generated using a tool such as VIRTUOSO® available from CADENCE DESIGN SYSTEMS, Inc., or another suitable layout generating tool. In some embodiments, the layout design is generated based on a netlist which is created based on the schematic design. In some embodiments, method 800 or 900 is implemented by a manufacturing device to manufacture an integrated circuit using a set of masks manufactured based on one or more layout designs generated by system 1000. In some embodiments, system 1000 is a manufacturing device to manufacture an integrated circuit using a set of masks manufactured based on one or more layout designs of the present disclosure. In some embodiments, system 1000 of FIG. 10 generates layout designs of an IC that are smaller than other approaches. In some embodiments, system 1000 of FIG. 10 generates layout designs of an IC (e.g., memory cell 100A, memory cell array 200A-200C, at least one memory cell of array of cells 302 of memory cell array 300, or integrated circuit 700) that occupy less area than other approaches.

Figure 11:
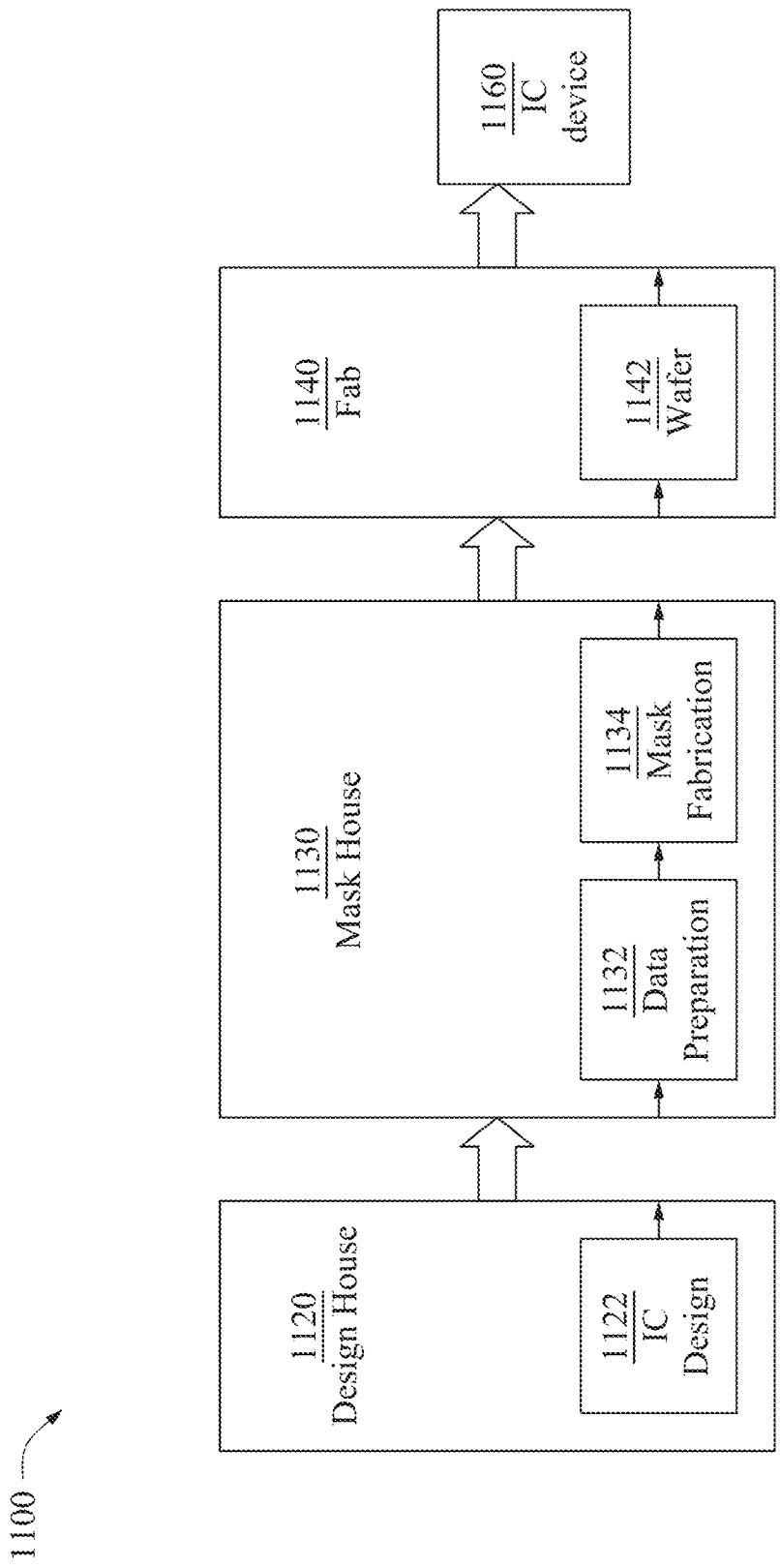
FIG. 11 is a block diagram of an IC manufacturing system, and an IC manufacturing flow associated therewith, in accordance with at least one embodiment of the present disclosure.

FIG. 11 is a block diagram of an integrated circuit (IC) manufacturing system 1100, and an IC manufacturing flow associated therewith, in accordance with at least one embodiment of the present disclosure.

In FIG. 11, IC manufacturing system 1100 includes entities, such as a design house 1120, a mask house 1130, and an IC manufacturer/fabricator ("fab") 1140, that interact with one another in the design, development, and manufacturing cycles and/or services related to manufacturing an IC device 1160. The entities in system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1120, mask house 1130, and IC fab 1140 is owned by a single larger company. In some embodiments, two or more of design house 1120, mask house 1130, and IC fab 1140 coexist in a common facility and use common resources.

Design house (or design team) 1120 generates an IC design layout 1122. IC design layout 1122 includes various geometrical patterns designed for an IC device 1160. The geometrical patterns correspond to patterns of metal, oxide, or semiconductor layers that make up the various components of IC device 1160 to be fabricated. The various layers combine to form various IC features. For example, a portion of IC design layout 1122 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 1120 implements a proper design procedure to form IC design layout 1122. The design procedure includes one or more of logic design, physical design or place and route. IC design layout 1122 is presented in one or more data files having information of the geometrical patterns. For example, IC design layout 1122 can be expressed in a GDSII file format or DFII file format.

Mask house 1130 includes mask data preparation 1132 (labelled as "data preparation 1132" in FIG. 11) and mask fabrication 1134. Mask house 1130 uses IC design layout 1122 to manufacture one or more masks to be used for fabricating the various layers of IC device 1160 according to IC design layout 1122. Mask house 1130 performs mask data preparation 1132, where IC design layout 1122 is translated into a representative data file ("RDF"). Mask data preparation 1132 provides the RDF to mask fabrication 1134. Mask fabrication 1134 includes a mask writer. A mask writer converts the RDF to an image on a substrate, such as a mask (reticle) or a semiconductor wafer. The design layout is manipulated by mask data preparation 1132 to comply with particular characteristics of the mask writer and/or requirements of IC fab 1140. In FIG. 11, mask data preparation 1132 and mask fabrication 1134 are illustrated as separate elements. In some embodiments, mask data preparation 1132 and mask fabrication 1134 can be collectively referred to as mask data preparation.

In some embodiments, mask data preparation 1132 includes optical proximity correction (OPC) which uses lithography enhancement techniques to compensate for image errors, such as those that can arise from diffraction, interference, other process effects and the like. OPC adjusts IC design layout 1122. In some embodiments, mask data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1132 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1134, which may undo part of the modifications performed by OPC in order to meet mask creation rules.

In some embodiments, mask data preparation 1132 includes lithography process checking (LPC) that simulates processing that will be implemented by IC fab 1140 to fabricate IC device 1160. LPC simulates this processing based on IC design layout 1122 to create a simulated manufactured device, such as IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 1122.

It should be understood that the above description of mask data preparation 1132 has been simplified for the purposes of clarity. In some embodiments, data preparation 1132 includes additional features such as a logic operation (LOP) to modify the IC design layout according to manufacturing rules. Additionally, the processes applied to IC design layout 1122 during data preparation 1132 may be executed in a variety of different orders.

After mask data preparation 1132 and during mask fabrication 1134, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by mask fabrication 1134 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1140 is an IC fabrication entity that includes one or more manufacturing facilities for the fabrication of a variety of different IC products. In some embodiments, IC Fab 1140 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

IC fab 1140 uses the mask (or masks) fabricated by mask house 1130 to fabricate IC device 1160. Thus, IC fab 1140 at least indirectly uses IC design layout 1122 to fabricate IC device 1160. In some embodiments, a semiconductor wafer 1142 is fabricated by IC fab 1140 using the mask (or masks)

to form IC device 1160. Semiconductor wafer 1142 includes a silicon substrate or other proper substrate having material layers formed thereon. Semiconductor wafer further includes one or more of various doped regions, dielectric features, multilevel interconnects, and the like (formed at subsequent manufacturing steps).

System 1100 is shown as having design house 1120, mask house 1130 or IC fab 1140 as separate components or entities. However, it is understood that one or more of design house 1120, mask house 1130 or IC fab 1140 are part of the same component or entity.

Details regarding an integrated circuit (IC) manufacturing system (e.g., system 1100 of FIG. 11), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20100040838, published Feb. 6, 2014, and U.S. Pat. No. 7,260,442, granted Aug. 21, 2007, the entireties of each of which are hereby incorporated by reference.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

One aspect of this description relates to a memory circuit. In some embodiments, the memory circuit includes a first read device and a first program device. In some embodiments, the first read device is coupled to a first bit line. In some embodiments, the first program device is coupled to the first read device. In some embodiments, the first read device includes a first transistor coupled to a first word line, and a second transistor coupled to the first word line. In some embodiments, the first program device includes a third transistor coupled to a second word line, and a fourth transistor coupled to the second word line. In some embodiments, the second transistor is coupled in parallel with the first transistor. In some embodiments, the fourth transistor is coupled in parallel with the third transistor. In some embodiments, the first transistor includes a first terminal, a second terminal and a third terminal. In some embodiments, the second transistor includes a first terminal, a second terminal and a third terminal. In some embodiments, the first terminal of the first transistor, the first terminal of the second transistor and the first word line are coupled to each other. In some embodiments, the second terminal of the first transistor is coupled to the second terminal of the second transistor. In some embodiments, the third terminal of the first transistor is coupled to at least the third terminal of the second transistor. In some embodiments, the third transistor includes a first terminal, a second terminal and a third terminal. In some embodiments, the fourth transistor includes a first terminal, a second terminal and a third terminal. In some embodiments, the first terminal of the third transistor, the first terminal of the fourth transistor and the second word line are coupled to each other. In some embodiments, the second terminal of the third transistor, the second terminal of the fourth transistor, the third terminal of the first transistor and the third terminal of the second transistor are coupled to each other. In some embodiments, the third terminal of the third transistor, the third terminal of the fourth transistor and the first bit line are coupled to each other. In some embodiments, the memory circuit further includes a second read device and a second program device. In some embodiments, the second read device is coupled to the first bit line. In some embodiments, the second read device includes a fifth transistor coupled to a third word line and a sixth transistor coupled to the third word line. In some embodiments, the second program device is coupled to the second read device. In some embodiments, the second program device includes a seventh transistor coupled to a fourth word line and an eighth transistor coupled to the fourth word line. In some embodiments, the fifth transistor includes a first terminal, a second terminal and a third terminal. In some embodiments, the sixth transistor includes a first terminal, a second terminal and a third terminal. In some embodiments, the first terminal of the fifth transistor, the first terminal of the sixth transistor and the first word line are coupled to each other. In some embodiments, the second terminal of the fifth transistor is coupled to the second terminal of the sixth transistor. In some embodiments, the third terminal of the fifth transistor is coupled to at least the third terminal of the sixth transistor. In some embodiments, the seventh transistor includes a first terminal, a second terminal and a third terminal. In some embodiments, the eighth transistor includes a first terminal, a second terminal and a third terminal. In some embodiments, the first terminal of the seventh transistor, the first terminal of the eighth transistor and the second word line are coupled to each other. In some embodiments, the second terminal of the seventh transistor, the second terminal of the eighth transistor, the third terminal of the fifth transistor and the third terminal of the sixth transistor are coupled to each other. In some embodiments, the third terminal of the seventh transistor, the third terminal of the eighth transistor and the first bit line are coupled to each other. In some embodiments, each of the first transistor, the second transistor the third transistor and the fourth transistor includes an n-type metal oxide semiconductor (NMOS) transistor. In some embodiments, each of the first transistor, the second transistor the third transistor and the fourth transistor includes a p-type metal oxide semiconductor (PMOS) transistor.

Another aspect of this description relates to a memory cell array. In some embodiments, the memory cell array includes a first bit line, a first word line, a second word line and a first memory cell. In some embodiments, the first bit line extends in a first direction. In some embodiments, the first word line extends in a second direction different from the first direction. In some embodiments, the second word line extends in the second direction. In some embodiments, the first memory cell is coupled to the first bit line, the first word line and the second word line. In some embodiments, the first memory cell includes a first read device and a first program device. In some embodiments, the first read device is coupled to the first bit line and the second word line. In some embodiments, the first program device is coupled to the first word line and the first read device. In some embodiments, the first program device includes a first transistor and the second transistor. In some embodiments, the first transistor is coupled to the first word line. In some embodiments, the second transistor is coupled in parallel with the first transistor, and is coupled to the first word line. In some embodiments, the first memory cell further includes a first read device coupled to the first bit line and the second word line. In some embodiments, the first read device includes a third transistor coupled to the second word line, the first bit line, the first transistor and the second transistor. In some embodiments, the first read device further includes a fourth transistor and the fifth transistor. In some embodiments, the fourth transistor is coupled to the second word line, the first bit line, the first transistor and the second transistor. In some embodiments, the fifth transistor is coupled to the second word line, the first bit line, the first transistor and the second transistor. In some embodiments, the fourth transistor, the fifth transistor and the third transistor are coupled in parallel with each other. In some embodiments, the memory cell array further includes a third word line, a fourth word line and a second memory cell. In some embodiments, the third word line extends in the second direction. In some embodiments, the fourth word line extends in the second direction. In some embodiments, the second memory cell is coupled to the first bit line, the third word line and the fourth word line. In some embodiments, the second memory cell includes a second read device and a second program device. In some embodiments, the second read device is coupled to the first bit line and a third word line. In some embodiments, the second program device is coupled with the fourth word line and the first read device. In some embodiments, a number of transistors in the second program device is different from a number of transistors in the second read device. In some embodiments, wherein a number of transistors in at least the second program device or the second read device is different from a number of transistors in at least the first program device or the first read device. In some embodiments, the first memory cell is a one-time programmable (OTP) non-volatile memory (NVM).

Still another aspect of this description relates to a method of manufacturing a memory cell circuit. In some embodiments, the method includes generating by a processor, a first program device layout corresponding to fabricating a first program device of the memory circuit, generating a first read device layout corresponding to fabricating a first read device of the memory circuit, and manufacturing the memory circuit based on at least the first program device layout or the first read device layout. In some embodiments, the first read device layout is adjacent to the first read device layout. In some embodiments, generating the first program device layout includes generating a first transistor layout design corresponding to fabricating a first transistor of the first program device, and generating a second transistor layout design corresponding to fabricating a second transistor of the first program device. In some embodiments, the first transistor and the second transistor share a first gate, and are coupled in parallel with each other. In some embodiments, the method further includes generating a second program device layout corresponding to fabricating a second program device of the memory circuit. In some embodiments, generating the second program device layout includes generating a third transistor layout design corresponding to fabricating a third transistor of the second program device, and generating a fourth transistor layout design corresponding to fabricating a fourth transistor of the second program device. In some embodiments, the third transistor and the fourth transistor share a second gate, and the third transistor is coupled in parallel with the fourth transistor. In some embodiments, the generating the first transistor layout design, the second layout design, the third transistor layout design or the fourth layout design includes generating a first active region layout pattern in a second active region layout pattern, and generating a set of gate layout patterns. In some embodiments, the first active region layout pattern and the second active region layout pattern extend in a first direction, are located on a first layout level, and are separated from one another in a second direction different from the first direction. In some embodiments, the first active region layout pattern corresponds to fabricating a first active region of the first transistor and the third transistor. In some embodiments, the second active region layout pattern corresponds to fabricating a second active region of the second transistor and the fourth transistor. In some embodiments, the set of gate layout patterns extends in a second direction different from the first direction. In some embodiments, the set of gate layout patterns overlap the first active region layout pattern and the second active region layout pattern. In some embodiments, the set of gate layout patterns is located on a second layout level different from the first layout level. In some embodiments, the set of gate layout patterns corresponds to fabricating a set of gates including the first gate and the second gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
a first read device coupled to a first bit line, the first read device comprising:
a first transistor coupled to a first word line; and
a second transistor coupled to the first word line; and
a first program device coupled to the first read device, the first program device comprising:
a third transistor coupled to a second word line, the third transistor comprises a first terminal, a second terminal and a third terminal; and
a fourth transistor coupled to the second word line, the fourth transistor comprises a first terminal, a second terminal and a third terminal, the fourth transistor is coupled in parallel with the third transistor;
wherein the first terminal of the third transistor and the first terminal of the fourth transistor are directly connected to each other, and further connected to the first word line,
the second terminal of the third transistor and the second terminal of the fourth transistor, are directly connected to each other, and
the third terminal of the third transistor and the third terminal of the fourth transistor are directly connected to each other, and further connected to the first bit line.

2. The memory circuit of claim 1, wherein the second transistor is coupled in parallel with the first transistor.

3. The memory circuit of claim 1, wherein
the first transistor comprises a first terminal, a second terminal and a third terminal; and
the second transistor comprises a first terminal, a second terminal and a third terminal,
the first terminal of the first transistor, the first terminal of the second transistor and the first word line are coupled to each other,
the second terminal of the first transistor is coupled to the second terminal of the second transistor, and
the third terminal of the first transistor is coupled to at least the third terminal of the second transistor.

4. The memory circuit of claim 3, wherein
the second terminal of the third transistor and the second terminal of the fourth transistor are further connected to the third terminal of the first transistor and the third terminal of the second transistor.

5. The memory circuit of claim 1, further comprising:
a second read device coupled to the first bit line, the second read device comprising:
  a fifth transistor coupled to a third word line; and
  a sixth transistor coupled to the third word line; and
a second program device coupled to the second read device, the second program device comprising:
  a seventh transistor coupled to a fourth word line; and
  an eighth transistor coupled to the fourth word line.

6. The memory circuit of claim 5, wherein
the fifth transistor comprises a first terminal, a second terminal and a third terminal; and
the sixth transistor comprises a first terminal, a second terminal and a third terminal,
  the first terminal of the fifth transistor, the first terminal of the sixth transistor and the first word line are coupled to each other,
  the second terminal of the fifth transistor is coupled to the second terminal of the sixth transistor, and
  the third terminal of the fifth transistor is coupled to at least the third terminal of the sixth transistor.

7. The memory circuit of claim 6, wherein
the seventh transistor comprises a first terminal, a second terminal and a third terminal; and
the eighth transistor comprises a first terminal, a second terminal and a third terminal,
  the first terminal of the seventh transistor, the first terminal of the eighth transistor and the second word line are coupled to each other,
  the second terminal of the seventh transistor, the second terminal of the eighth transistor, the third terminal of the fifth transistor and the third terminal of the sixth transistor are coupled to each other, and
  the third terminal of the seventh transistor, the third terminal of the eighth transistor and the first bit line are coupled to each other.

8. The memory circuit of claim 5, wherein a number of transistors in the second program device is different from a number of transistors in the first program device.

9. The memory circuit of claim 1, wherein each of the first transistor, the second transistor the third transistor and the fourth transistor comprises an n-type metal oxide semiconductor (NMOS) transistor.

10. The memory circuit of claim 1, wherein each of the first transistor, the second transistor, the third transistor and the fourth transistor comprises a p-type metal oxide semiconductor (PMOS) transistor.

11. A memory cell array comprising:
a first bit line extending in a first direction;
a first word line extending in a second direction different from the first direction;
a second word line extending in the second direction; and
a first memory cell coupled to the first bit line, the first word line and the second word line, the first memory cell comprising:
  a first read device coupled to the first bit line and the second word line; and
  a first program device coupled to the first word line and the first read device, the first program device comprising:
    a first transistor coupled to the first word line, the first transistor comprises a first source terminal and a first drain terminal; and
    a second transistor coupled in parallel with the first transistor, and coupled to the first word line, the second transistor comprises a second source terminal and a second drain terminal;
    wherein the first source terminal and the second source terminal are directly connected to each other, and the first drain terminal and the second drain terminal are directly connected to each other.

12. The memory cell array of claim 11, wherein the first read device comprises:
a third transistor coupled to the second word line, the first bit line, the first transistor and the second transistor.

13. The memory cell array of claim 12, wherein the first read device further comprises:
a fourth transistor coupled to the second word line, the first bit line, the first transistor and the second transistor; and
a fifth transistor coupled to the second word line, the first bit line, the first transistor and the second transistor, and the fourth transistor, the fifth transistor and the third transistor being coupled in parallel with each other.

14. The memory cell array of claim 11, further comprising:
a third word line extending in the second direction;
a fourth word line extending in the second direction; and
a second memory cell coupled to the first bit line, the third word line and the fourth word line, the second memory cell comprising:
  a second read device coupled to the first bit line and the third word line; and
  a second program device coupled to the fourth word line and the first read device.

15. The memory cell array of claim 14, wherein a number of transistors in at least the second program device or the second read device is different from a number of transistors in at least the first program device or the first read device.

16. The memory cell array of claim 11, wherein the first memory cell is a one-time programmable (OTP) non-volatile memory (NVM).

17. A memory cell array comprising:
a first bit line extending in a first direction;
a first word line extending in a second direction different from the first direction;
a second word line extending in the second direction and being separated from the first word line in the first direction; and
a first memory cell coupled to the first bit line, the first word line and the second word line, the first memory cell comprising:
  a first program device coupled to the first word line, the first program device comprising:
    a first transistor coupled to the first word line, the first transistor comprises a first source terminal and a first drain terminal; and
    a second transistor coupled to the first transistor and the first word line, the second transistor comprises a second source terminal and a second drain terminal;
    wherein the first source terminal and the second source terminal are directly connected to each other, and the first drain terminal and the second drain terminal are directly connected to each other; and
  a first read device coupled to the first program device, the first bit line and the second word line, the first read device comprising:
    a third transistor coupled to the second word line, the first bit line, the first transistor and the second transistor; and a fourth transistor coupled to the second word line, and the fourth transistor and the third transistor being coupled in parallel with each other.

18. The memory cell array of claim 17, wherein the fourth transistor is further coupled to the first bit line, the first transistor and the second transistor.

19. The memory cell array of claim 17, further comprising:
- a third word line extending in the second direction, and being separated from the first word line, and the second word line in the first direction;
- a fourth word line extending in the second direction and being separated from the first word line, the second word line and the third word line in the first direction; and
- a second memory cell coupled to the first bit line, the third word line and the fourth word line, the second memory cell comprising:
  - a second read device coupled to the first bit line and the third word line; and
  - a second program device coupled to the fourth word line and the first read device.

20. The memory cell array of claim 17, wherein
the third transistor comprises a third source terminal and a third drain terminal; and
the fourth transistor comprises a fourth source terminal and a fourth drain terminal;
wherein the third source terminal and the fourth source terminal are directly connected to each other, and
the third drain terminal and the fourth drain terminal are directly connected to each other.

* * * * *